(12) United States Patent
Yang et al.

(10) Patent No.: US 9,881,884 B2
(45) Date of Patent: Jan. 30, 2018

(54) SEMICONDUCTOR DEVICE STRUCTURE AND METHOD FOR FORMING THE SAME

(71) Applicant: TAIWAN SEMICONDUCTOR MANUFACTURING CO., LTD., Hsinchu (TW)

(72) Inventors: Ming-Hsien Yang, Taichung (TW); Ching-Chun Wang, Tainan (TW); Dun-Nian Yaung, Taipei (TW); Feng-Chi Hung, Chu-Bei (TW); Sin-Yao Huang, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/933,619

(22) Filed: Nov. 5, 2015

(65) Prior Publication Data

US 2017/0047301 A1 Feb. 16, 2017

Related U.S. Application Data

(60) Provisional application No. 62/205,526, filed on Aug. 14, 2015.

(51) Int. Cl.
*H01L 23/52* (2006.01)
*H01L 23/532* (2006.01)
(Continued)

(52) U.S. Cl.
CPC ........ *H01L 24/05* (2013.01); *H01L 21/76898* (2013.01); *H01L 23/481* (2013.01); *H01L 23/5226* (2013.01); *H01L 23/5329* (2013.01); *H01L 23/53209* (2013.01); *H01L 24/03* (2013.01); *H01L 24/11* (2013.01); *H01L 24/13* (2013.01); *H01L 24/43* (2013.01);
(Continued)

(58) Field of Classification Search
CPC ..... H01L 24/05; H01L 23/5226; H01L 24/03; H01L 24/11; H01L 24/13; H01L 24/43; H01L 24/46; H01L 27/14623
USPC ............................................ 257/737; 438/64
See application file for complete search history.

(56) References Cited

U.S. PATENT DOCUMENTS 6,306,750 B1   10/2001   Huang et al.
6,564,449 B1 *  5/2003   Tsai ................ H01L 24/03
                                                  257/E21.519

(Continued)

FOREIGN PATENT DOCUMENTS

JP          2004046731 A    2/2004

*Primary Examiner* — Moazzam Hossain
*Assistant Examiner* — Omar Mojaddedi
(74) *Attorney, Agent, or Firm* — Eschweiler & Potashnik, LLC

(57) ABSTRACT

A semiconductor device structure is provided. The semiconductor device structure includes a first semiconductor substrate having a first surface, a second surface, and a recess. The second surface is opposite to the first surface. The recess passes through the first semiconductor substrate. The semiconductor device structure includes a first wiring layer over the second surface. The semiconductor device structure includes a first bonding pad in the recess and extending to the first wiring layer so as to be electrically connected to the first wiring layer. The semiconductor device structure includes a nickel layer over the first bonding pad. The semiconductor device structure includes a gold layer over the nickel layer.

20 Claims, 34 Drawing Sheets

(51) Int. Cl.
   *H01L 23/00*      (2006.01)
   *H01L 23/522*     (2006.01)
   *H01L 23/48*      (2006.01)
   *H01L 21/768*     (2006.01)
   *H01L 27/146*     (2006.01)

(52) U.S. Cl.
   CPC ........ *H01L 24/46* (2013.01); *H01L 27/14634* (2013.01); *H01L 2924/01028* (2013.01); *H01L 2924/01046* (2013.01); *H01L 2924/01079* (2013.01)

(56) References Cited

U.S. PATENT DOCUMENTS

| | | | |
|---|---|---|---|
| 7,883,917 B2 | 2/2011 | Liu et al. | |
| 2005/0179137 A1* | 8/2005 | Usami | H01L 23/53238 257/762 |
| 2008/0284014 A1* | 11/2008 | Lee | H01L 23/3107 257/737 |
| 2010/0164109 A1* | 7/2010 | Chiou | H01L 21/6835 257/754 |
| 2012/0098122 A1* | 4/2012 | Yang | B81C 1/0023 257/737 |
| 2012/0175728 A1* | 7/2012 | Yang | H01L 23/564 257/508 |
| 2012/0205769 A1* | 8/2012 | Tsai | H01L 27/1464 257/460 |
| 2013/0009270 A1* | 1/2013 | Tsai | H01L 23/481 257/459 |
| 2013/0249047 A1* | 9/2013 | Hung | H01L 21/76898 257/506 |
| 2014/0002188 A1* | 1/2014 | Chen | H03F 3/19 330/250 |
| 2014/0061842 A1* | 3/2014 | Ting | H01L 27/14687 257/448 |
| 2014/0077374 A1* | 3/2014 | Lin | H01L 23/528 257/741 |
| 2014/0215421 A1 | 7/2014 | Chen et al. | |
| 2015/0214162 A1* | 7/2015 | Lai | H01L 24/05 257/738 |
| 2015/0364458 A1* | 12/2015 | Ho | H01L 24/92 438/107 |

\* cited by examiner

SEMICONDUCTOR DEVICE STRUCTURE AND METHOD FOR FORMING THE SAME

CROSS REFERENCE TO RELATED APPLICATIONS

This application claims the benefit of U.S. Provisional Application No. 62/205,526, filed on Aug. 14, 2015, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1L-1 is a top view of the bonding pad, the nickel layer, and the gold layer of FIG. 1L, in accordance with some embodiments.

FIG. 1L-2 is a top view of the bonding pad, the nickel layer, and the gold layer of FIG. 1L, in accordance with some embodiments.

FIG. 1L-3 is a top view of the bonding pad, the nickel layer, and the gold layer of FIG. 1L, in accordance with some embodiments.

FIG. 2 is a cross-sectional view of a semiconductor device structure, in accordance with some embodiments.

FIG. 3 is a cross-sectional view of a semiconductor device structure, in accordance with some embodiments.

DETAILED DESCRIPTION

Figure 1A:
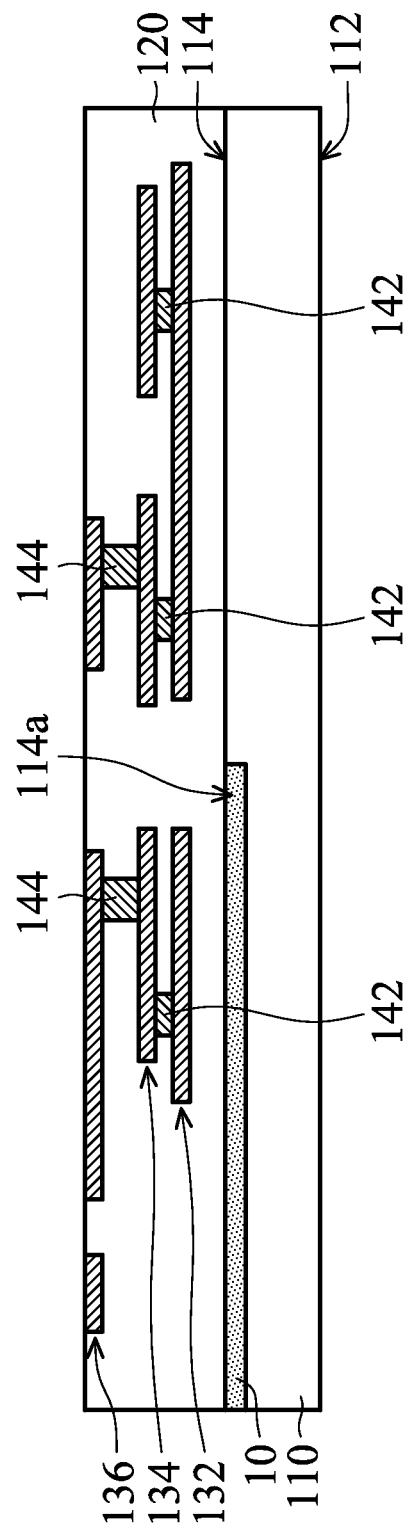
FIGS. 1A-1L are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1L are cross-sectional views of various stages of a process for forming a semiconductor device structure, in accordance with some embodiments.

As shown in FIG. 1A, a semiconductor substrate 110 is provided, in accordance with some embodiments. The semiconductor substrate 110 has surfaces 112 and 114 opposite to each other, in accordance with some embodiments. The semiconductor substrate 110 is a semiconductor wafer (such as a silicon wafer) or a portion of a semiconductor wafer, in accordance with some embodiments.

In some embodiments, the semiconductor substrate 110 is made of an elementary semiconductor material including silicon or germanium in a single crystal, polycrystal, or amorphous structure. In some other embodiments, the semiconductor substrate 110 is made of a compound semiconductor such as silicon carbide, gallium arsenide, gallium phosphide, indium phosphide, indium arsenide, an alloy semiconductor such as SiGe, or GaAsP, or a combination thereof. The semiconductor substrate 110 may also include multi-layer semiconductors, semiconductor on insulator (SOI) (such as silicon on insulator or germanium on insulator), or a combination thereof.

As shown in FIG. 1A, the surface 114 has a recess 114a, in accordance with some embodiments. As shown in FIG. 1A, an insulating layer 10 is formed in the recess 114a, in accordance with some embodiments. The insulating layer 10 is filled in the recess 114a, in accordance with some embodiments.

The insulating layer 10 is made of any suitable insulating material, such as hydrogenated silicon oxycarbide (SiCO: H), silicon oxynitride, silicon oxide, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments.

As shown in FIG. 1A, a dielectric layer 120 is deposited over the surface 114 and the insulating layer 10, in accordance with some embodiments. The dielectric layer 120 is a multi-layer structure, in accordance with some embodiments. The dielectric layer 120 includes dielectric layers stacked with each other (not shown), in accordance with some embodiments.

The dielectric layer 120 is made of any suitable dielectric material, such as hydrogenated silicon oxycarbide (SiCO: H), silicon oxynitride, silicon oxide, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 120 is deposited by any suitable process, such as a CVD process, HDPCVD process, spin-on process, sputtering process, or a combination thereof, in accordance with some embodiments.

As shown in FIG. 1A, wiring layers 132 and 134 are formed in the dielectric layer 120, in accordance with some embodiments. In some embodiments, a wiring layer 136 is embedded in the dielectric layer 120. The wiring layer 136 is exposed by the dielectric layer 120, in accordance with some embodiments. The wiring layers 132, 134, and 136 are made of any suitable conductive material, such as copper, a copper alloy, silver, gold, aluminum, or a combination thereof.

As shown in FIG. 1A, conductive via structures 142 and 144 are formed in the dielectric layer 120, in accordance with some embodiments. The conductive via structures 142 electrically connect the wiring layer 132 to the wiring layer 134, in accordance with some embodiments. The conductive via structures 144 electrically connect the wiring layer 134 to the wiring layer 136, in accordance with some embodiments.

Figure 1B:
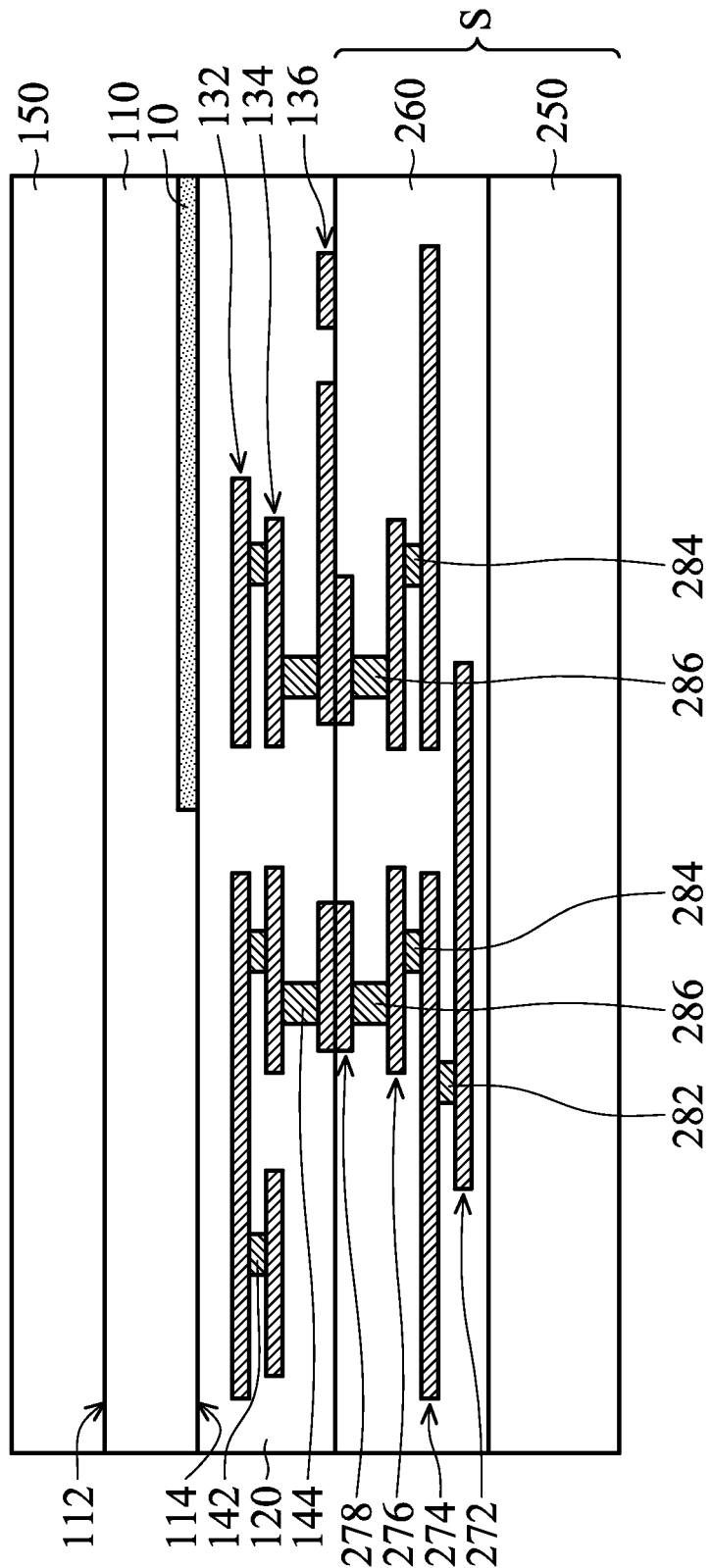

As shown in FIG. 1B, the semiconductor substrate 110 is flipped upside down, in accordance with some embodiments. As shown in FIG. 1B, a semiconductor substrate 250 is provided, in accordance with some embodiments. The semiconductor substrate 250 is a semiconductor wafer (such as a silicon wafer) or a portion of a semiconductor wafer, in accordance with some embodiments. In some embodiments, the semiconductor substrate 250 is made of an elementary semiconductor material including silicon or germanium in a single crystal, polycrystal, or amorphous structure.

In some other embodiments, the semiconductor substrate 250 is made of a compound semiconductor such as silicon carbide, gallium arsenide, gallium phosphide, indium phosphide, indium arsenide, an alloy semiconductor such as SiGe, or GaAsP, or a combination thereof. The semiconductor substrate 250 may also include multi-layer semiconductors, semiconductor on insulator (SOI) (such as silicon on insulator or germanium on insulator), or a combination thereof.

As shown in FIG. 1B, a dielectric layer 260 is deposited over the semiconductor substrate 250, in accordance with some embodiments. The dielectric layer 260 is a multi-layer structure, in accordance with some embodiments. The dielectric layer 260 includes dielectric layers stacked with each other (not shown), in accordance with some embodiments.

The dielectric layer 260 is made of any suitable dielectric material, such as hydrogenated silicon oxycarbide (SiCO: H), silicon oxynitride, silicon oxide, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 260 is deposited by any suitable process, such as a CVD process, HDPCVD process, spin-on process, sputtering process, or a combination thereof, in accordance with some embodiments.

As shown in FIG. 1B, wiring layers 272, 274, and 276 are formed in the dielectric layer 260, in accordance with some embodiments. In some embodiments, a wiring layer 278 is embedded in the dielectric layer 260. The wiring layer 278 is exposed by the dielectric layer 260, in accordance with some embodiments. The wiring layers 272, 274, 276, and 278 are made of any suitable conductive material, such as copper, a copper alloy, silver, gold, aluminum, or a combination thereof.

As shown in FIG. 1B, conductive via structures 282, 284, and 286 are formed in the dielectric layer 260, in accordance with some embodiments. The conductive via structures 282 electrically connect the wiring layer 272 to the wiring layer 274, in accordance with some embodiments. The conductive via structures 284 electrically connect the wiring layer 274 to the wiring layer 276, in accordance with some embodiments.

The conductive via structures 286 electrically connect the wiring layer 276 to the wiring layer 278, in accordance with some embodiments. The semiconductor substrate 250, the dielectric layer 260, the wiring layers 272, 274, 276, and 278, and the conductive via structures 282, 284, and 286 together form a wiring substrate S, in accordance with some embodiments.

As shown in FIG. 1B, the dielectric layers 260 and 120 are bonded with each other, in accordance with some embodiments. The wiring layers 278 and 136 are bonded with each other, in accordance with some embodiments. The wiring layers 278 and 136 are electrically connected with each other, in accordance with some embodiments.

As shown in FIG. 1B, a dielectric layer 150 is formed over the surface 112, in accordance with some embodiments. The dielectric layer 150 is a transparent layer, in accordance with some embodiments. The dielectric layer 150 includes a high-k material, in accordance with some embodiments. The dielectric layer 150 includes oxide and/or nitride, in accordance with some embodiments.

The dielectric layer 150 includes silicon oxide, silicon nitride, and/or silicon oxynitride, in accordance with some embodiments. The dielectric layer 150 is formed by any suitable process, such as a CVD process, HDPCVD process, spin-on process, sputtering process, or a combination thereof, in accordance with some embodiments.

Figure 1C:
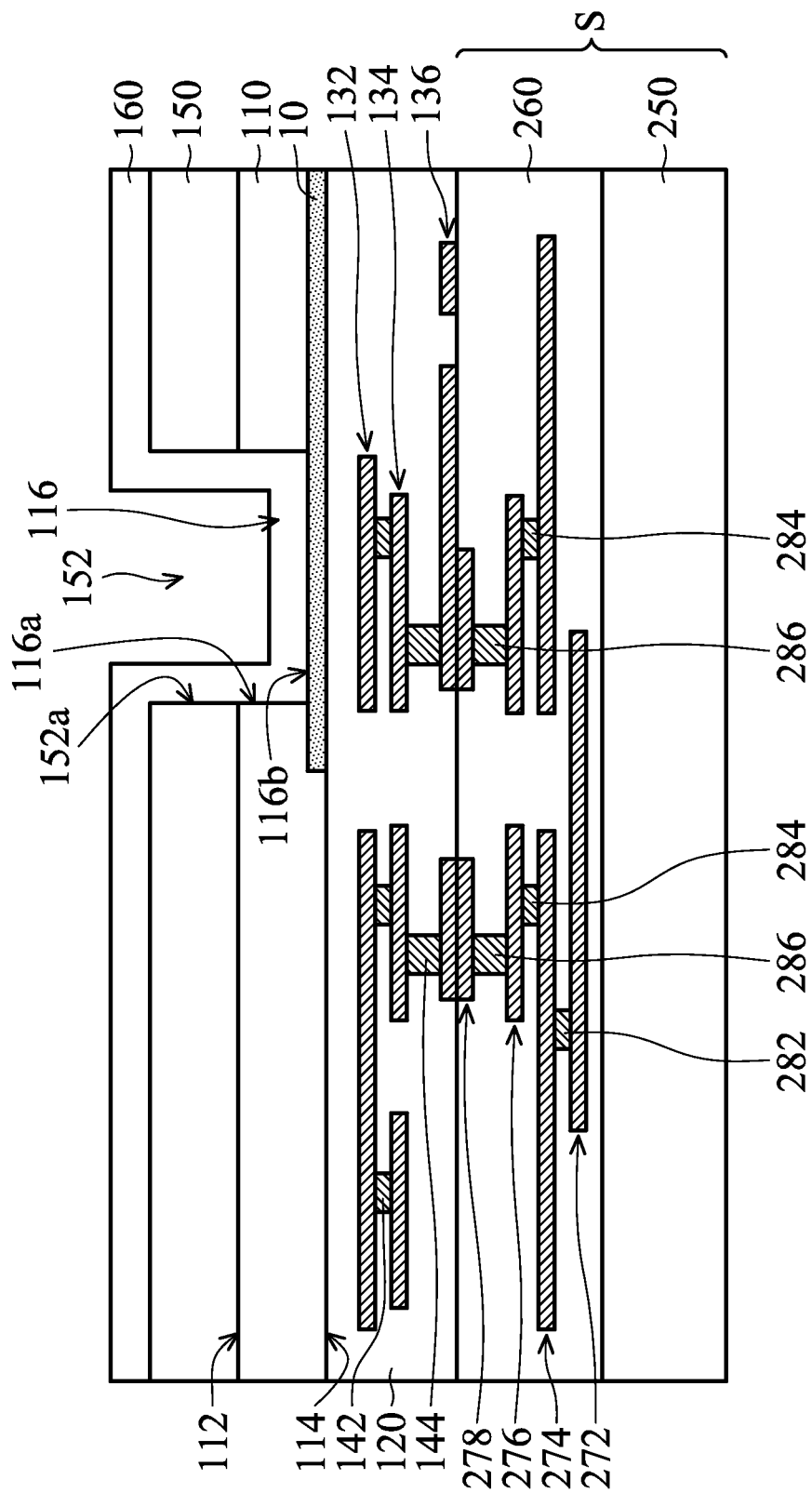

As shown in FIG. 1C, portions of the dielectric layer 150 and the semiconductor substrate 110 are removed, in accordance with some embodiments. After the removal process, an opening 152 and a recess 116 are formed, in accordance with some embodiments. The opening 152 passes through the dielectric layer 150, in accordance with some embodiments.

The recess 116 is formed in the semiconductor substrate 110 and recessed from the surface 112, in accordance with some embodiments. The recess 116 passes through the semiconductor substrate 110, in accordance with some embodiments. The recess 116 exposes a portion of the insulating layer 10, in accordance with some embodiments. In some embodiments, the removal process includes a photolithography process and an etching process.

As shown in FIG. 1C, an insulating layer 160 is formed over the dielectric layer 150 to cover the sidewalls 152*a* of the opening 152 and the sidewalls 116*a* and the bottom surface 116*b* of the recess 116, in accordance with some embodiments. The insulating layer 160 is in direct contact with the insulating layer 10, in accordance with some embodiments. The insulating layer 160 includes oxide, such as silicon oxide, in accordance with some embodiments.

Figure 1D:
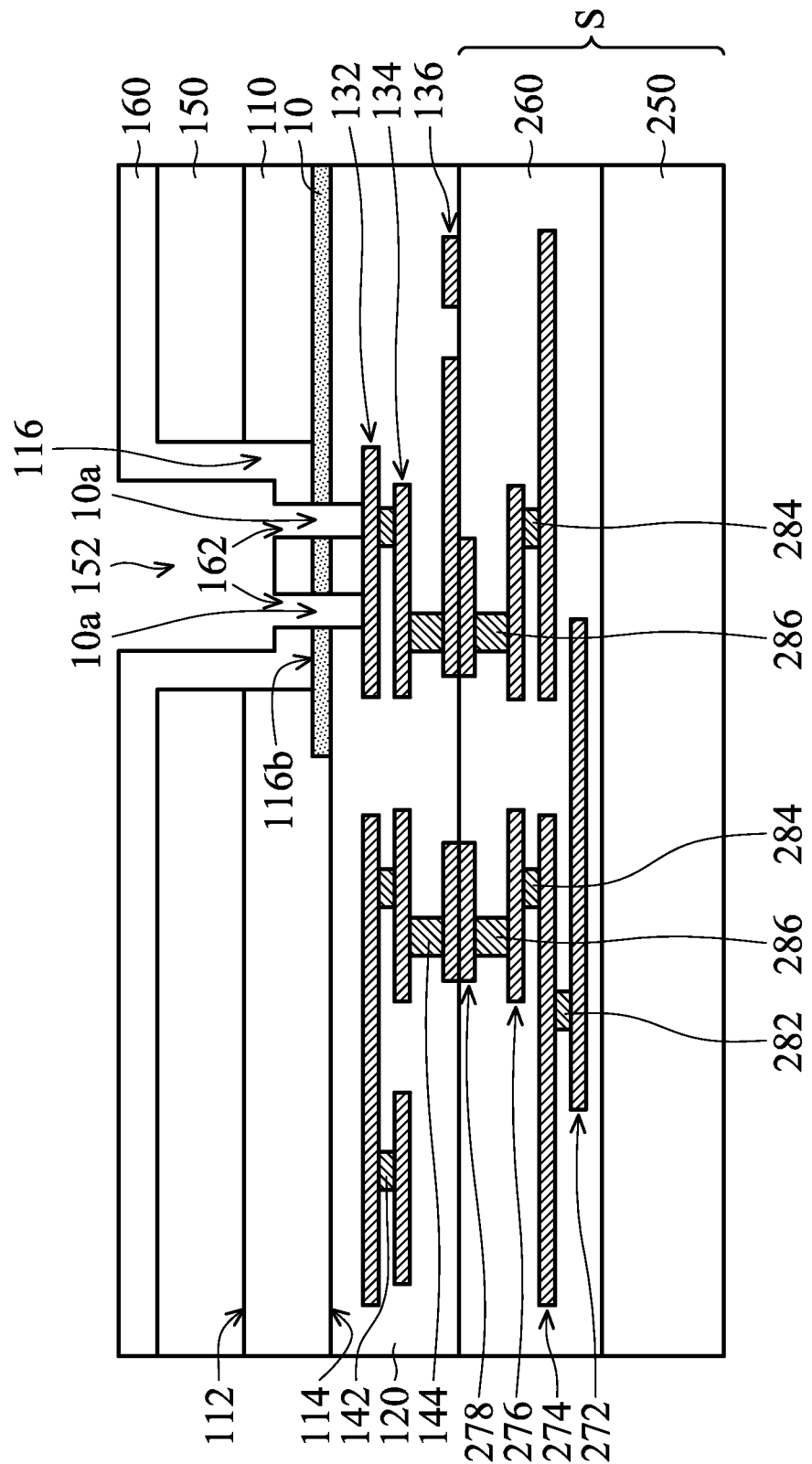

As shown in FIG. 1D, portions of the insulating layer 160, the insulating layer 10, and the dielectric layer 120 are removed, in accordance with some embodiments. After the removal process, openings 162 and vias 10*a* are formed, in accordance with some embodiments. The openings 162 pass through the insulating layer 160, in accordance with some embodiments. The vias 10*a* pass through the insulating layer 10 and penetrate into the dielectric layer 120 to expose the wiring layer 132, in accordance with some embodiments. The removal process includes a photolithography process and an etching process.

Figure 1E:
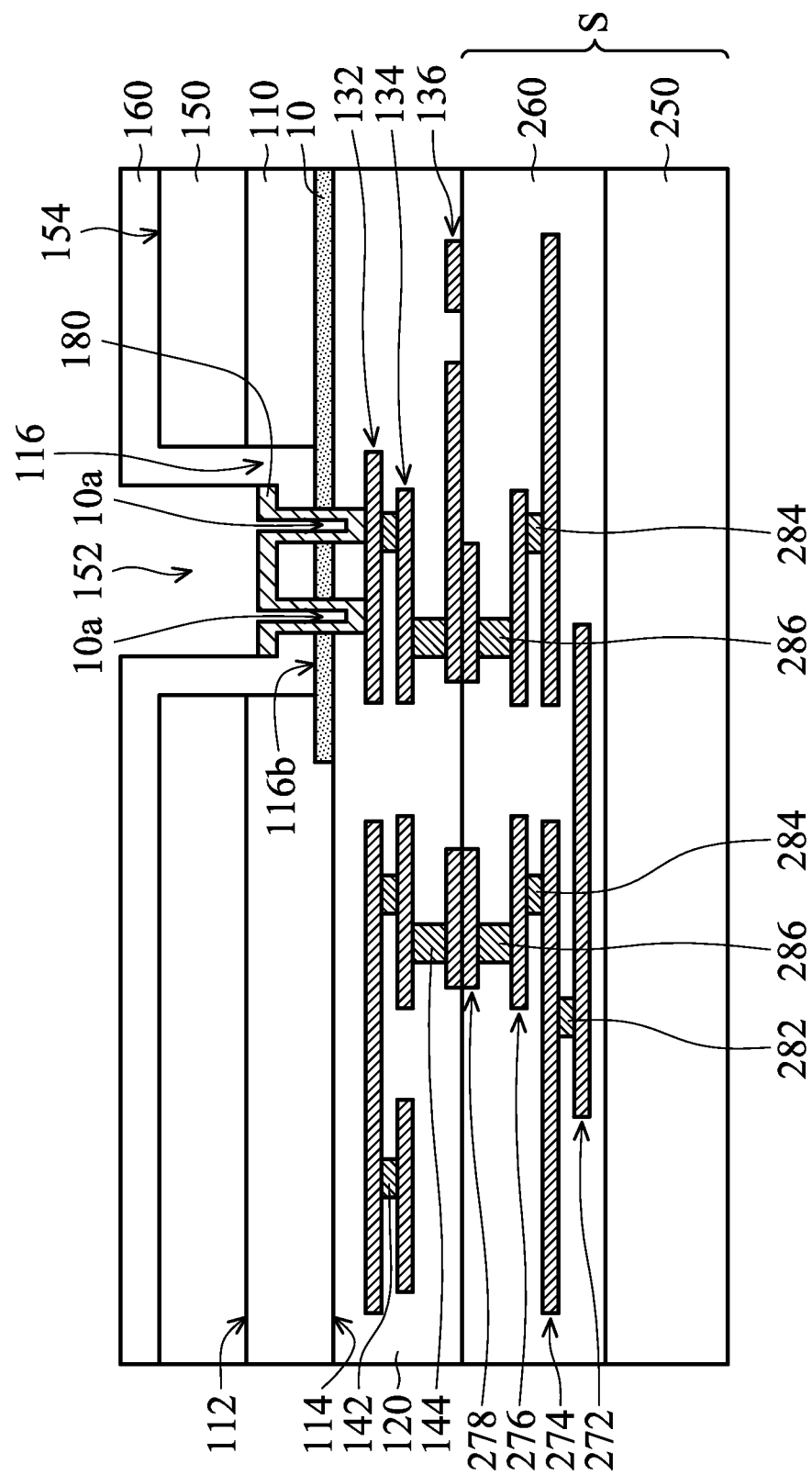

As shown in FIG. 1E, a bonding pad 180 is formed over the bottom surface 116*b* of the recess 116 and extends into the vias 10*a* to electrically connect to the wiring layer 132, in accordance with some embodiments. The bonding pad 180 includes a conductive material, in accordance with some embodiments. The bonding pad 180 includes aluminum or copper, in accordance with some embodiments. The bonding pad 180 is formed using a physical vapor deposition process, a photolithography process, and an etching process, in accordance with some embodiments.

Figure 1F:
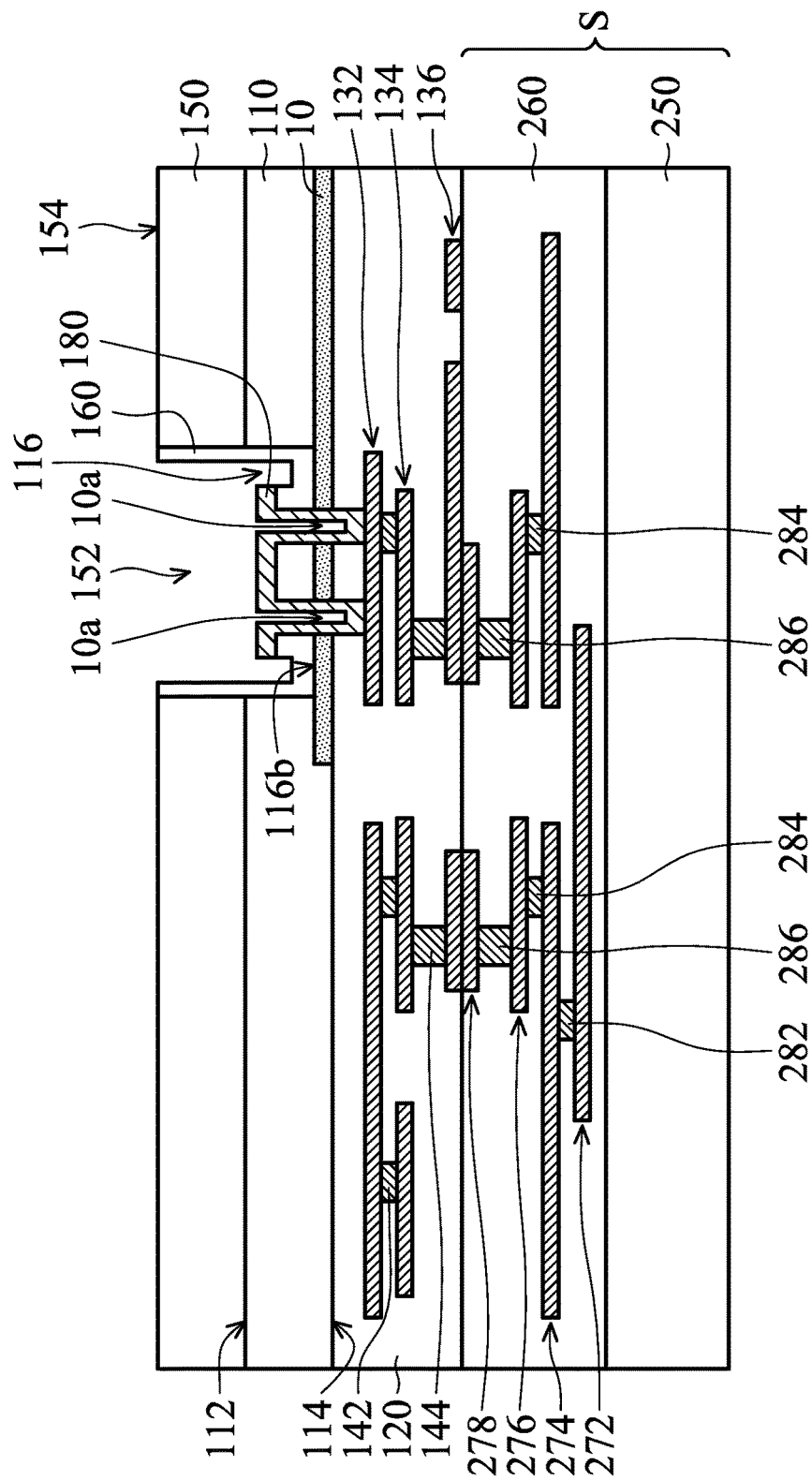

As shown in FIG. 1F, the insulating layer 160 over the top surface 154 of the dielectric layer 150 is removed, in accordance with some embodiments. The insulating layer 160 in the recess 116 and the opening 152 and exposed by the bonding pad 180 is thinned, in accordance with some embodiments. The removal and the thinning of the insulating layer 160 include an anisotropic etching process, in accordance with some embodiments. The anisotropic etching process includes a dry etching process, in accordance with some embodiments.

Figure 1G:
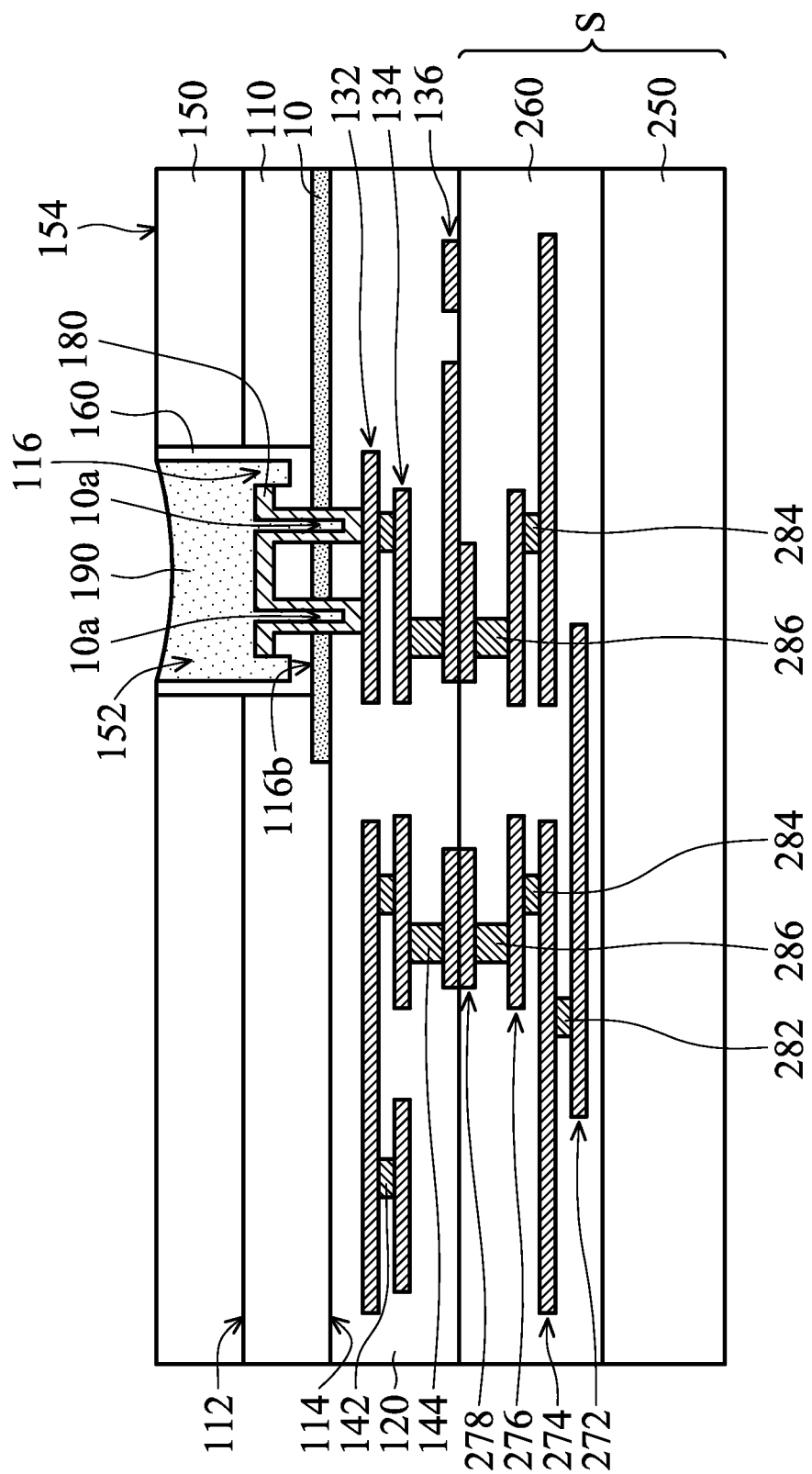

As shown in FIG. 1G, a dielectric filling layer 190 is formed in the recess 116, the opening 152, and the vias 10*a*, in accordance with some embodiments. The dielectric filling layer 190 is filled into the recess 116, the opening 152, and the vias 10*a*, in accordance with some embodiments. The formation of the dielectric filling layer 190 includes a deposition process and a chemical mechanical polishing process, in accordance with some embodiments. The dielectric filling layer 190 includes oxide (e.g., silicon oxide) or another suitable dielectric material.

Figure 1H:
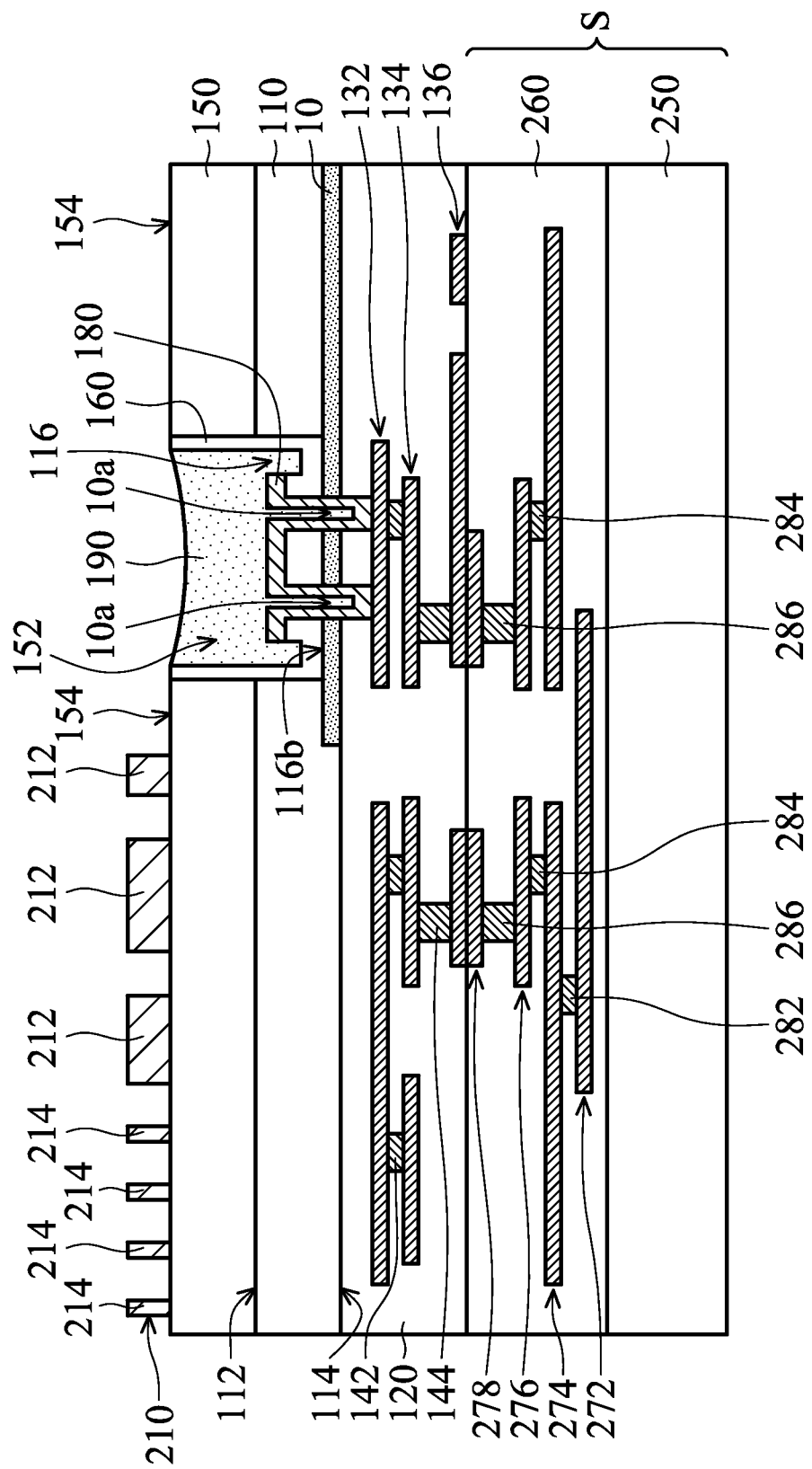

As shown in FIG. 1H, an opaque layer 210 is formed over the top surface 154 of the dielectric layer 150, in accordance with some embodiments. The opaque layer 210 has light-blocking portions 212 and grid portions 214, in accordance with some embodiments. The light-blocking portions 212 are configured to block the light from reaching photosensitive elements (e.g., photodiodes) over or in the semiconductor substrate 110, in accordance with some embodiments. The grid portions 214 are configured to guide the light towards photosensitive elements (e.g., photodiodes) over or in the semiconductor substrate 110, in accordance with some embodiments.

Figure 1I:
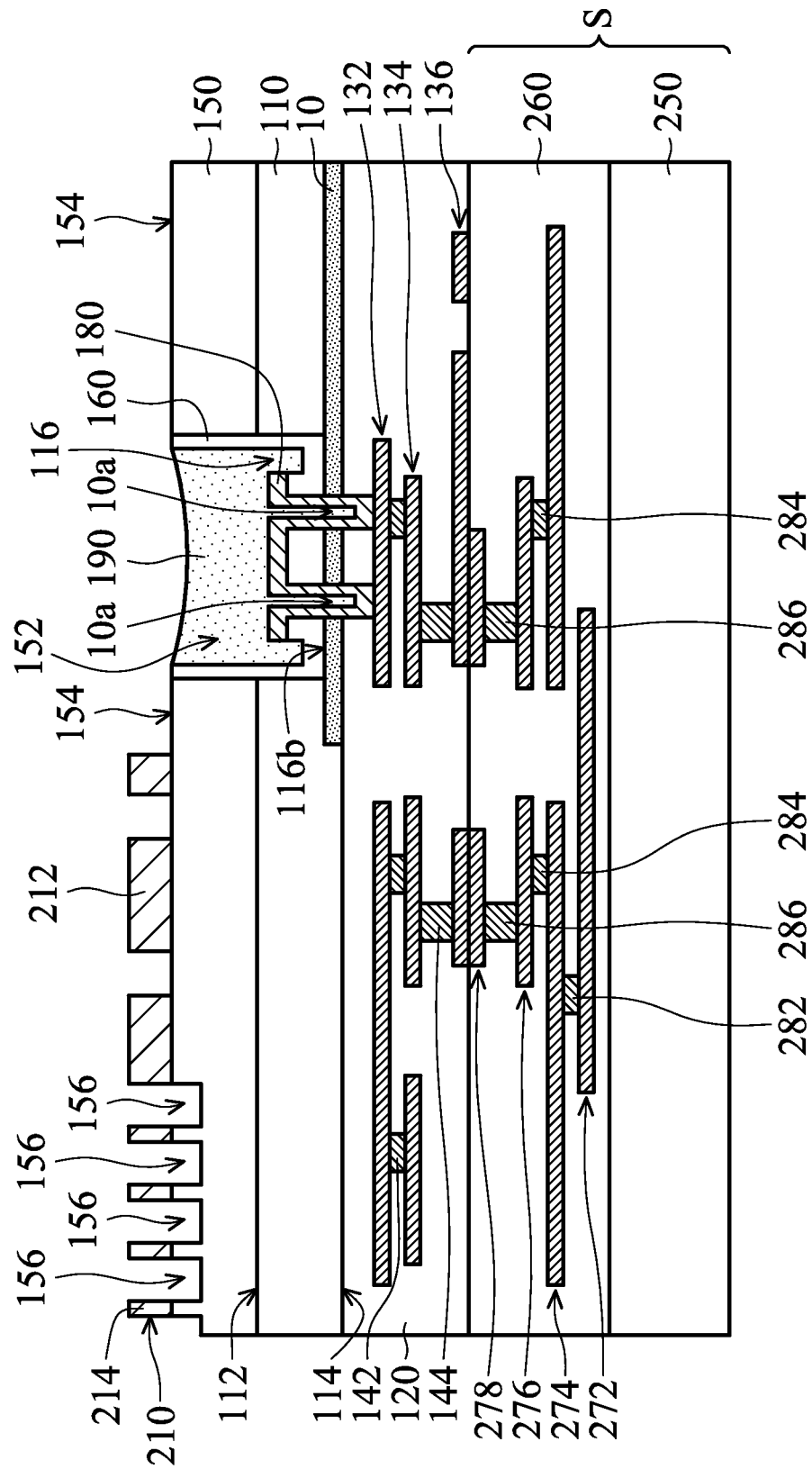

As shown in FIG. 1I, portions of the dielectric layer 150 between the grid portions 214 or between the grid portion 214 and the light-blocking portion 212 are removed, in accordance with some embodiments. The removal process forms recesses 156 in the dielectric layer 150 and between the grid portions 214 or between the grid portion 214 and the light-blocking portion 212, in accordance with some embodiments.

In some embodiments, a passivation layer (not shown) is formed over the opaque layer 210, the dielectric layer 150, the insulating layer 160, and the dielectric filling layer 190, in accordance with some embodiments. The passivation layer includes an insulating material, in accordance with some embodiments.

Figure 1J:
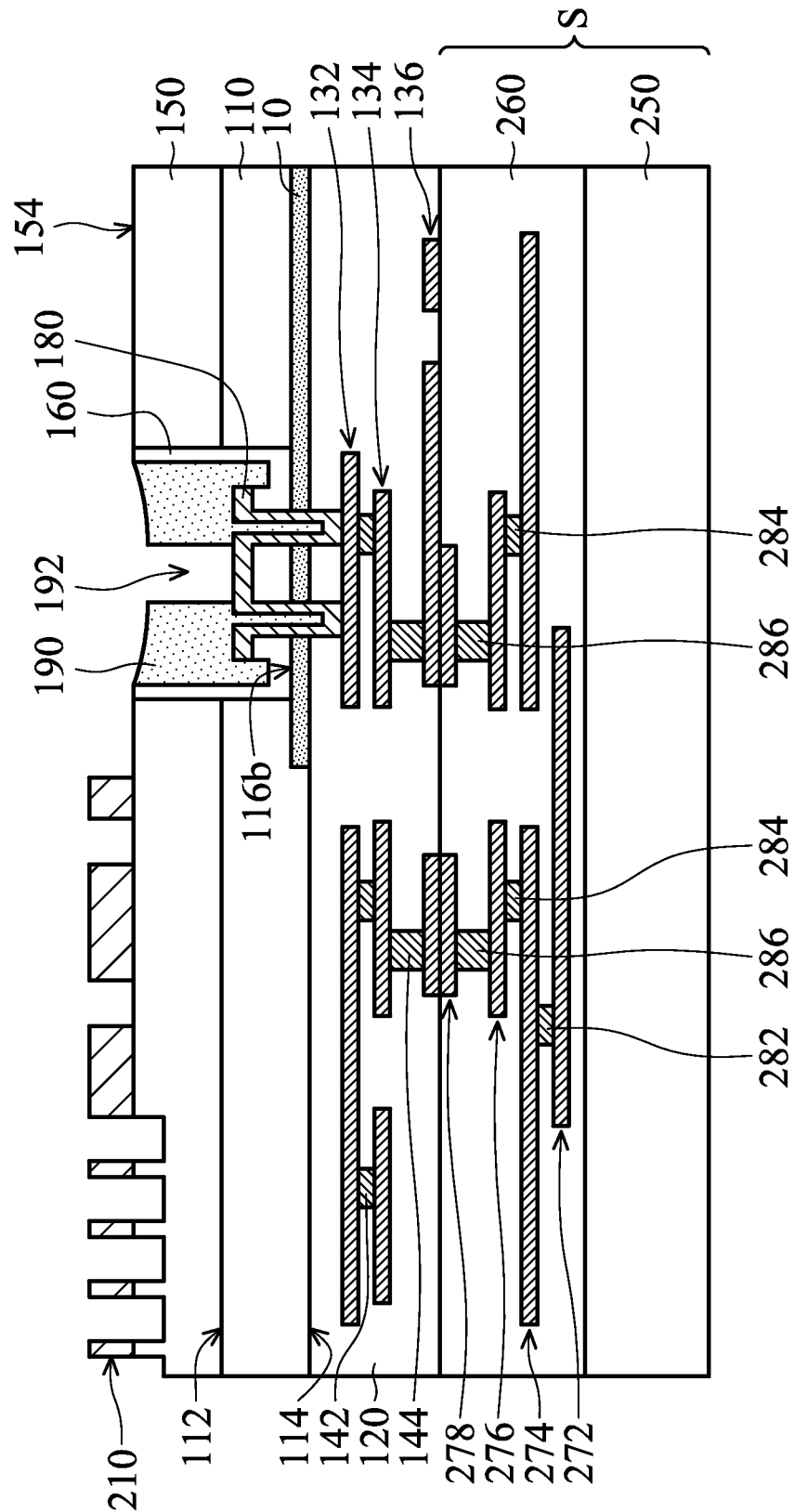

As shown in FIG. 1J, a portion of the dielectric filling layer 190 is removed, in accordance with some embodiments. The removal process forms an opening 192 in the dielectric filling layer 190, in accordance with some embodiments. The opening 192 exposes the bonding pad 180 over the bottom surface 116*b* (or the insulating layer 10), in accordance with some embodiments.

Figure 1K:
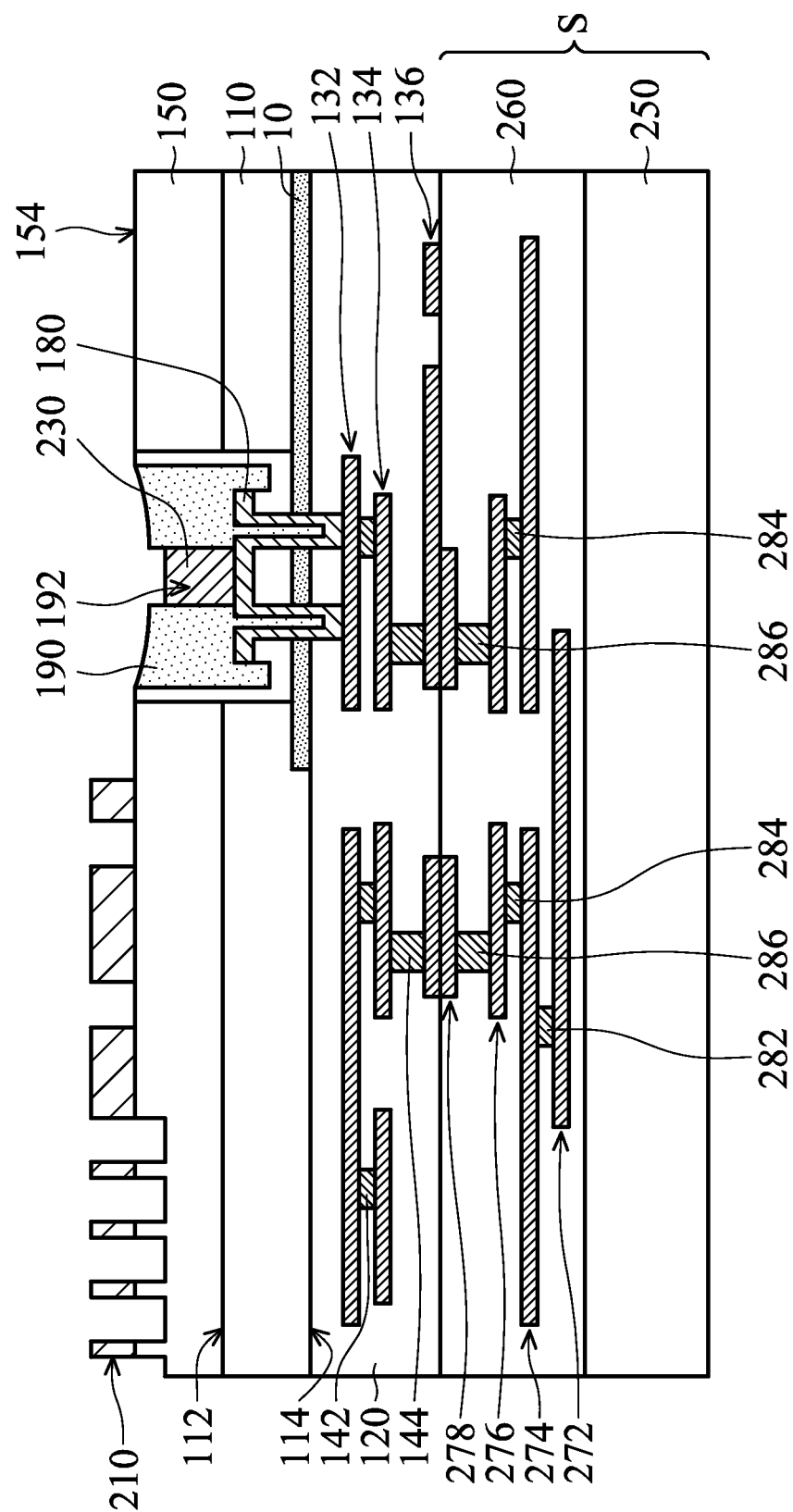

As shown in FIG. 1K, a nickel layer 230 is formed over the bonding pad 180, in accordance with some embodiments. The nickel layer 230 contains nickel as a major component, in accordance with some embodiments. The nickel layer 230 contains at least 60 wt % of nickel, in accordance with some embodiments. The nickel layer 230 contains at least 80 wt % of nickel, in accordance with some embodiments.

The nickel layer 230 is in the opening 192, in accordance with some embodiments. The entire nickel layer 230 is in the opening 192, in accordance with some embodiments. The nickel layer 230 does not extend outside of the opening 192, in accordance with some embodiments. The nickel layer 230 is a substantially planar layer, in accordance with some embodiments.

The nickel layer 230 is formed using an electroless plating process, in accordance with some embodiments. The electroless plating process is able to selectively deposit the nickel layer 230 on the metal layer (i.e., the bonding pad 180), in accordance with some embodiments. Therefore, the nickel layer 230 is formed without using a photolithography process and an etching process, in accordance with some embodiments.

Figure 1L:
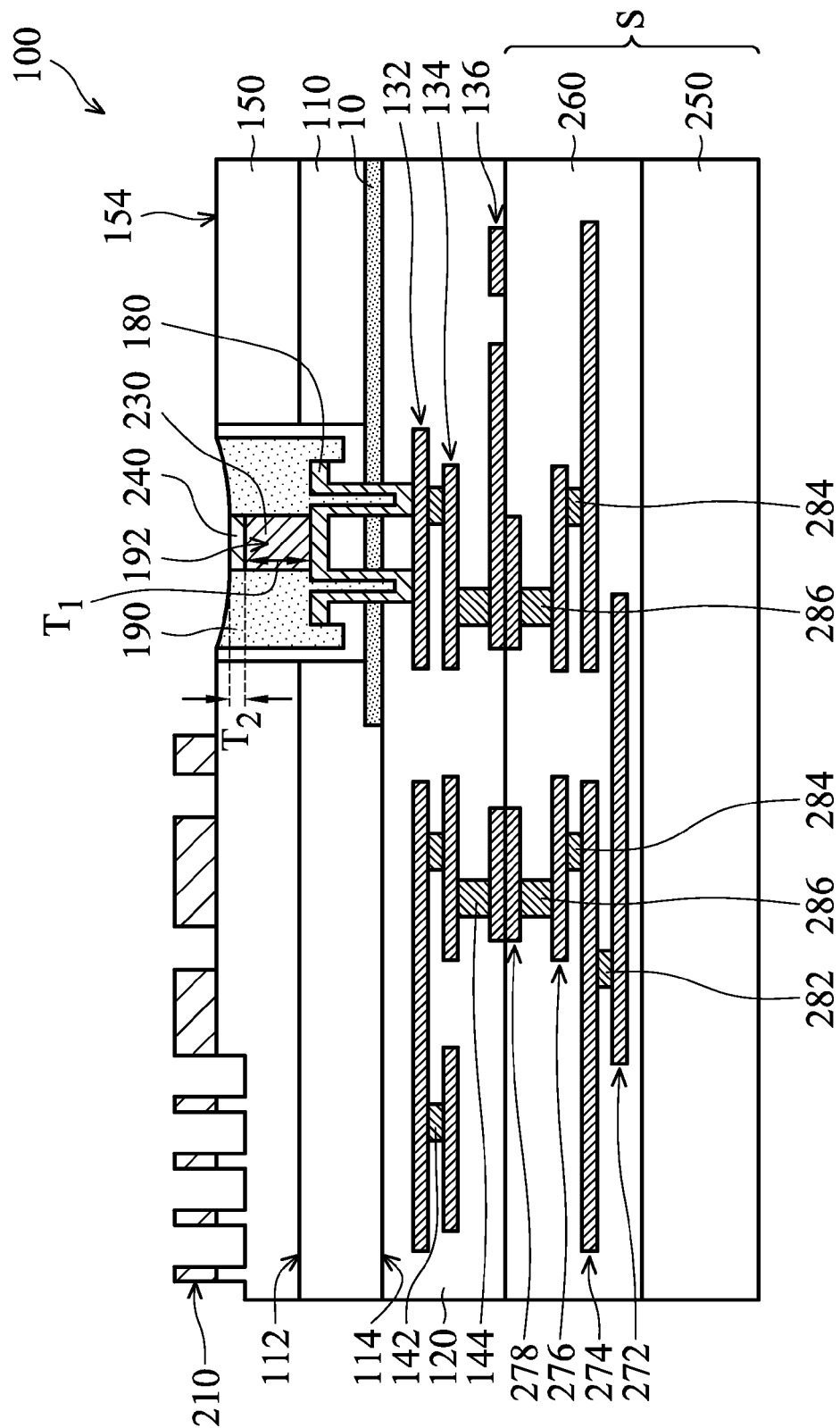

As shown in FIG. 1L, a gold layer 240 is formed over the nickel layer 230, in accordance with some embodiments. The gold layer 240 contains gold as a major component, in accordance with some embodiments. The gold layer 240 contains at least 60 wt % of gold, in accordance with some embodiments. The gold layer 240 contains at least 80 wt % of gold, in accordance with some embodiments.

The gold layer 240 is formed using an immersion plating process, in accordance with some embodiments. The gold layer 240 and the nickel layer 230 do not extend onto the surface 112, in accordance with some embodiments. The entire gold layer 240 and the entire nickel layer 230 are in the opening 192, in accordance with some embodiments. The thickness T1 of the nickel layer 230 is greater than the thickness T2 of the gold layer 240, in accordance with some embodiments.

The material of the bonding pad 180 is different from the material of the nickel layer 230 and the gold layer 240, in accordance with some embodiments. Since the Young's modulus of nickel is greater than that of the material of the bonding pad 180 (e.g., copper or aluminum), the normal strain of nickel is less than that of the material of the bonding pad 180 (e.g., copper or aluminum) under the same normal stress.

Therefore, the formation of the nickel layer 230 prevents the bonding pad 180 from peeling off during a wire pull test or a ball shear test performed subsequently. Since the hardness of gold is less than that of nickel, the gold layer 240 buffers the bonding stress generated by a wire bonding process or a ball bonding process performed subsequently. In this step, the semiconductor device structure 100 is substantially formed, in accordance with some embodiments.

In top view, the bonding pad 180 may have different shapes, and the nickel layer 230 and the gold layer 240 are formed over only the bonding pad 180 exposed by the opening 192. Examples of the bonding pad 180 with different shapes are illustrated in FIGS. 1L-1, 1L-2, and 1L-3.

Figures 1, 1L, 2:
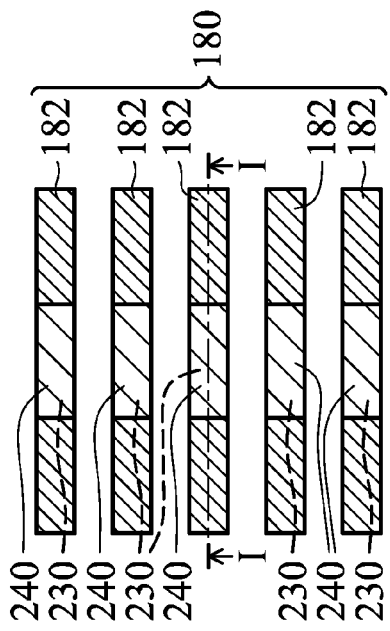
Figures 1, 1L:
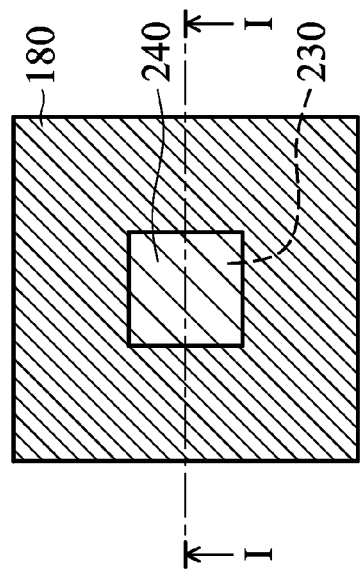

FIG. 1L-1 is a top view of the bonding pad 180, the nickel layer 230, and the gold layer 240 of FIG. 1L, in accordance with some embodiments. FIG. 1L is a cross-sectional view illustrating the bonding pad 180, the nickel layer 230, and the gold layer 240 along a sectional line I-I in FIG. 1L-1, in accordance with some embodiments. As shown in FIGS. 1L and 1L-1, the bonding pad 180 has an island-like shape, and the nickel layer 230 and the gold layer 240 are formed over the bonding pad 180.

FIG. 1L-2 is a top view of the bonding pad 180, the nickel layer 230, and the gold layer 240 of FIG. 1L, in accordance with other embodiments. FIG. 1L is a cross-sectional view illustrating the bonding pad 180, the nickel layer 230, and the gold layer 240 along a sectional line I-I in FIG. 1L-2, in accordance with some embodiments. As shown in FIGS. 1L and 1L-2, the bonding pad 180 has strip portions 182 spaced apart from each other, in accordance with some embodiments. The nickel layer 230 and the gold layer 240 are formed over the strip portions 182, in accordance with some embodiments.

FIG. 1L-3 is a top view of the bonding pad 180, the nickel layer 230, and the gold layer 240 of FIG. 1L, in accordance with still other embodiments. FIG. 1L is a cross-sectional view illustrating the bonding pad 180, the nickel layer 230, and the gold layer 240 along a sectional line I-I in FIG. 1L-3, in accordance with some embodiments. As shown in FIGS. 1L and 1L-3, the bonding pad 180 has a ring shape, in accordance with some embodiments. The nickel layer 230 and the gold layer 240 are formed over the bonding pad 180, in accordance with some embodiments.

FIG. 2 is a cross-sectional view of a semiconductor device structure, in accordance with some embodiments. As shown in FIG. 2, the semiconductor device structure 100 further includes a palladium layer 290, in accordance with some embodiments. The palladium layer 290 is formed between the nickel layer 230 and the gold layer 240, in accordance with some embodiments. The palladium layer 290 is formed using an electroless plating process, in accordance with some embodiments.

In some embodiments, palladium has physical properties similar to that of gold and is cheaper than gold. Therefore, the formation of the palladium layer 290 reduces the amount of gold used to form the gold layer 230, in accordance with some embodiments. As a result, the formation of the palladium layer 290 reduces the manufacturing cost of the semiconductor device structure 100, in accordance with some embodiments.

Figures 1, 1L, 2, 3:
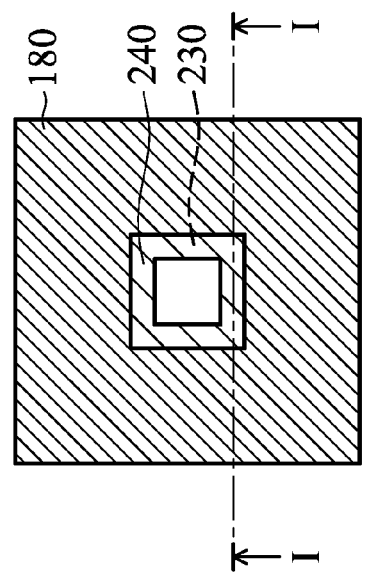
Figure 2:
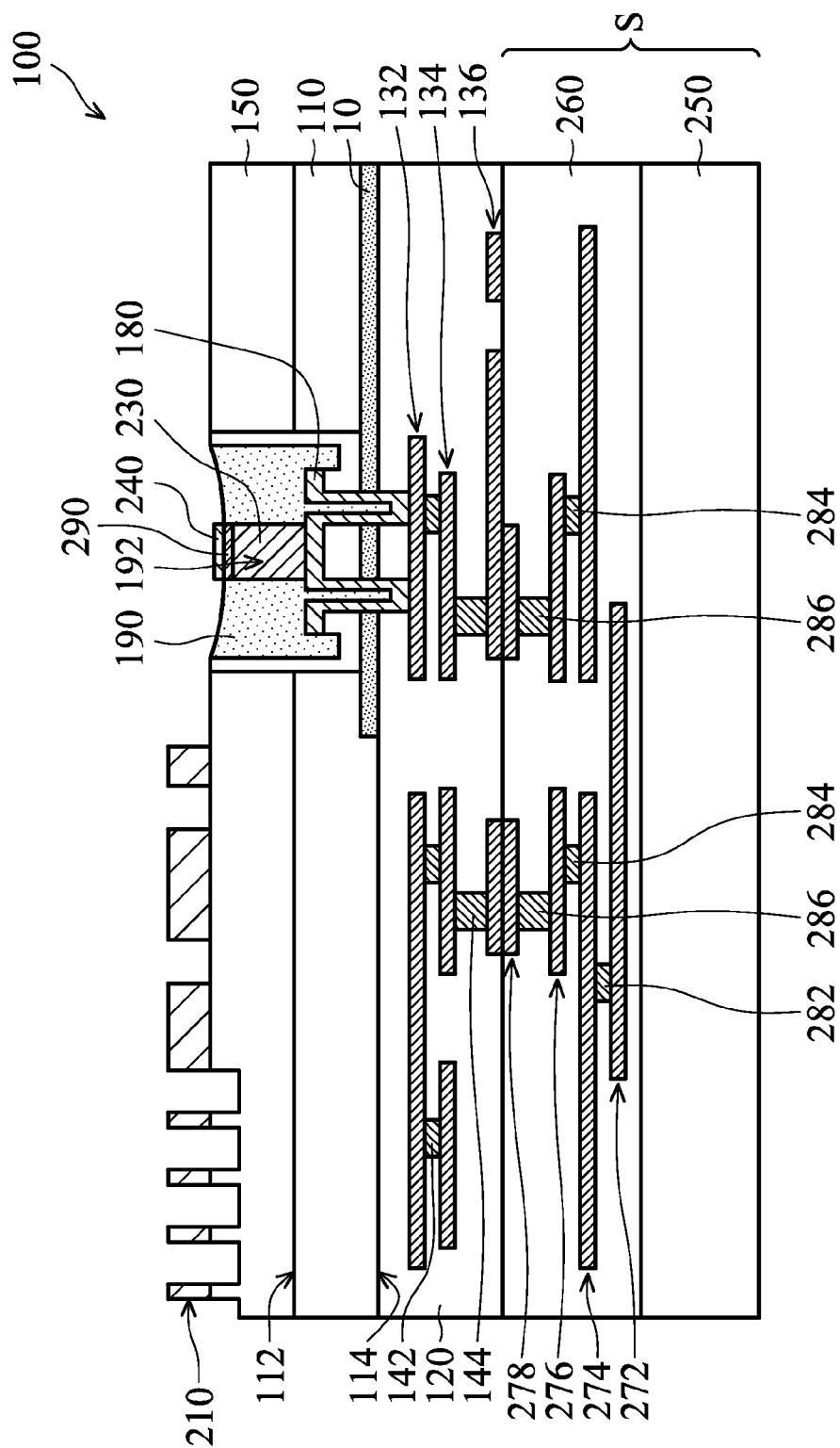
Figure 3:
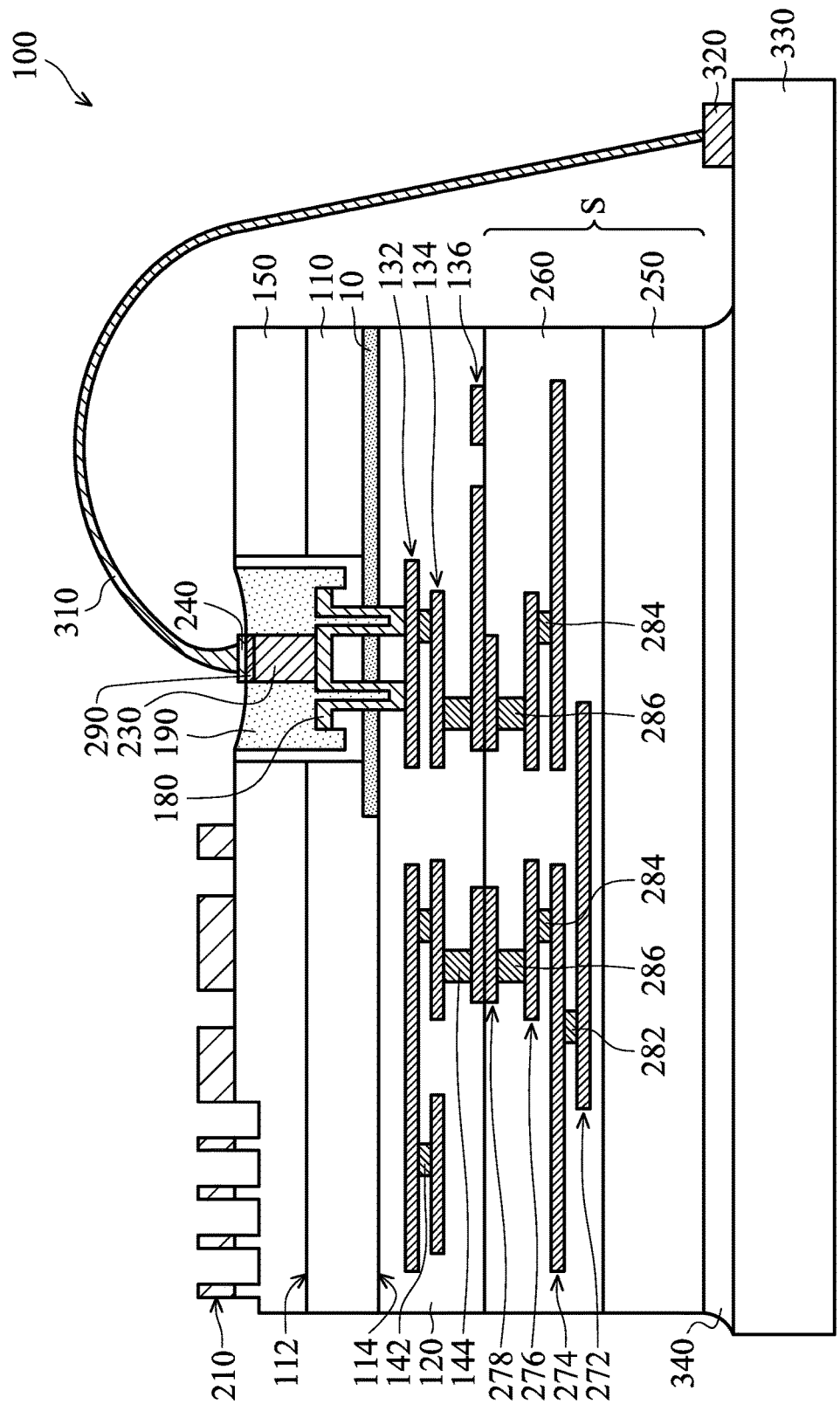

FIG. 3 is a cross-sectional view of a semiconductor device structure, in accordance with some embodiments. As shown in FIG. 3, the semiconductor device structure 100 further includes a conductive wire 310 connecting the gold layer 240 to a bonding pad 320, in accordance with some embodiments. The conductive wire 310 includes gold, aluminum, or another suitable conductive material. In some embodiments, the bonding pad 320 is positioned over a substrate 330. The bonding pad 320 includes a conductive material, such as copper or aluminum, in accordance with some embodiments.

The substrate 330 includes a semiconductor material, a plastic material, a metal material, a glass material, a ceramic material, or another suitable material. In some embodiments, an adhesive layer 340 is formed between the semiconductor substrate 250 and the substrate 330. The adhesive layer 340 includes a polymer material, in accordance with some embodiments. In some other embodiments, the semiconductor substrate 250 is not over the substrate 330.

Figure 4:
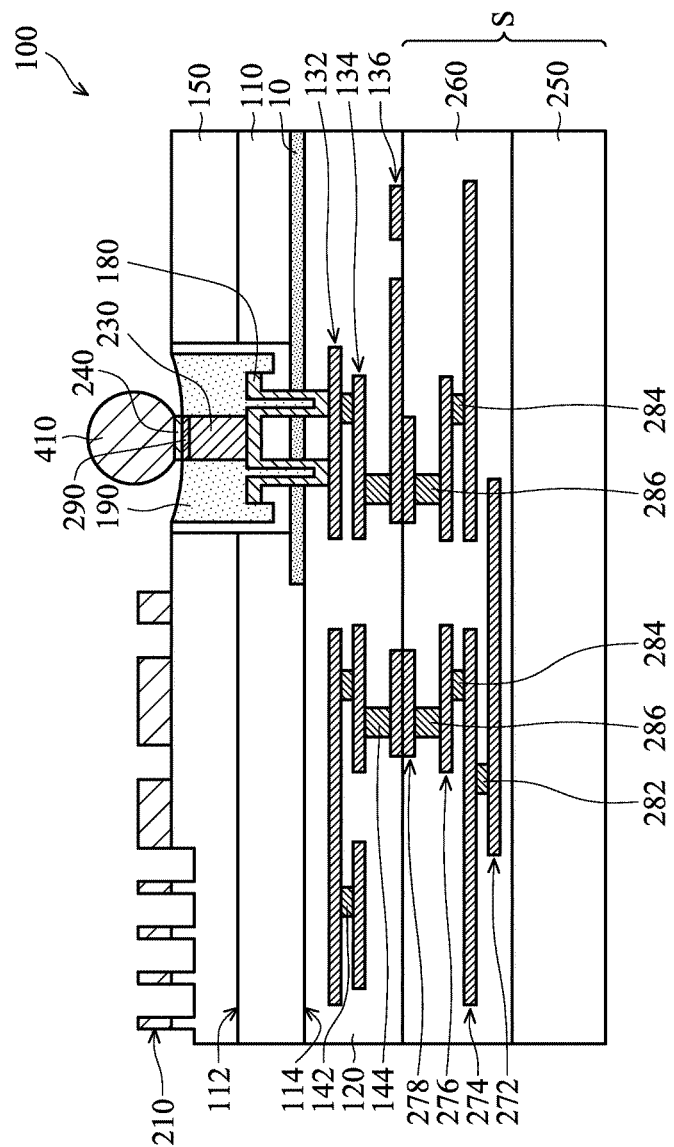
FIG. 4 is a cross-sectional view of a semiconductor device structure, in accordance with some embodiments.

FIG. 4 is a cross-sectional view of a semiconductor device structure, in accordance with some embodiments. As shown in FIG. 4, the semiconductor device structure 100 further includes a conductive bump 410 over the gold layer 240, in accordance with some embodiments. The conductive bump 410 is electrically connected to the gold layer 240, in accordance with some embodiments. The conductive bump 410 includes a conductive material, in accordance with some embodiments. The conductive bump 410 includes a solder material, such as tin (Sn) and copper (Cu), in accordance with some embodiments.

In some embodiments, the semiconductor device structure 100 does not have a bonding pad 180, and the detailed description is exemplarily illustrated as follows.

Figure 5A:
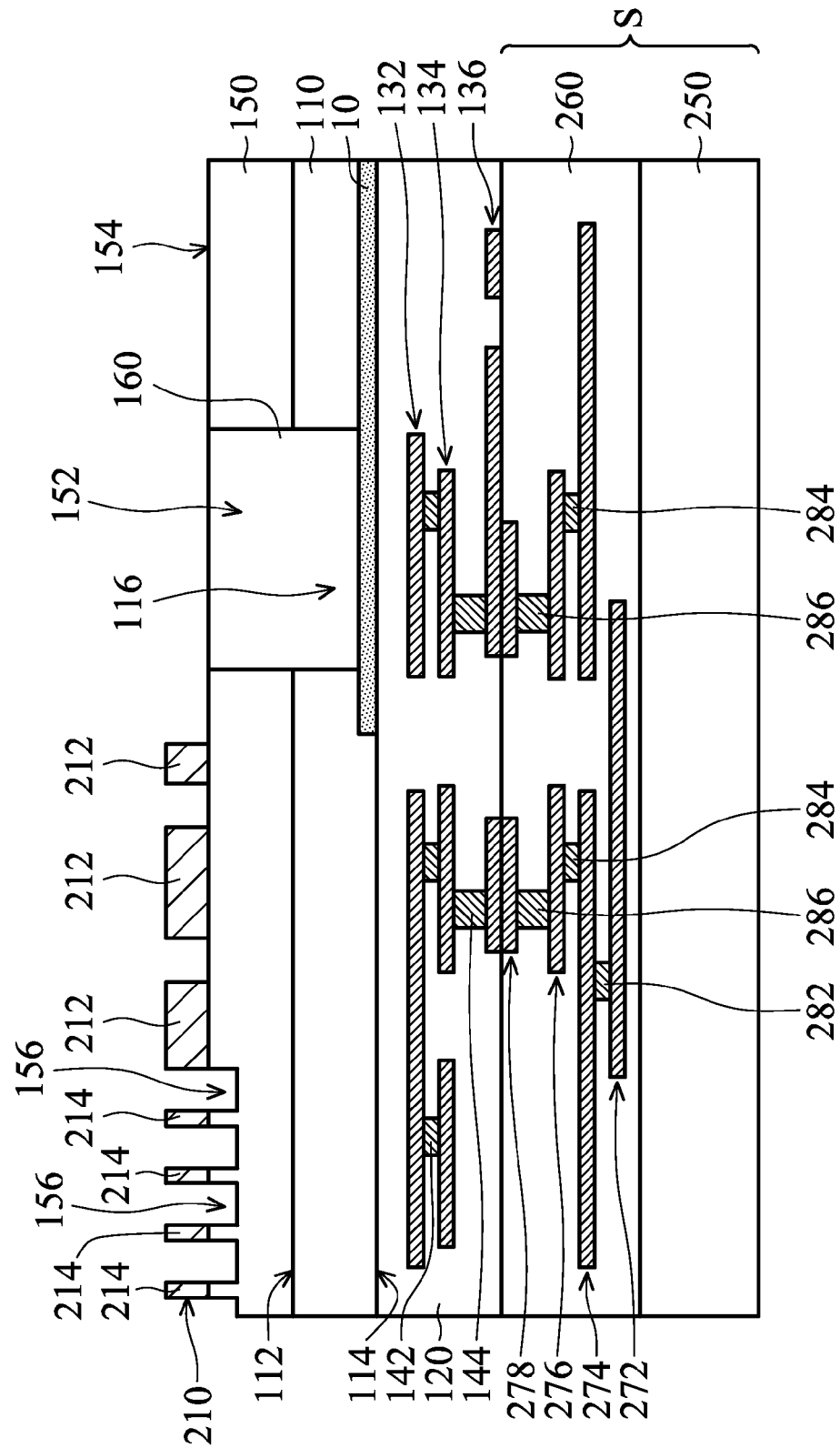
FIGS. 5A-5B are cross-sectional views of various stages of a process for forming a semiconductor device structure, in accordance with some embodiments.
Figure 5B:
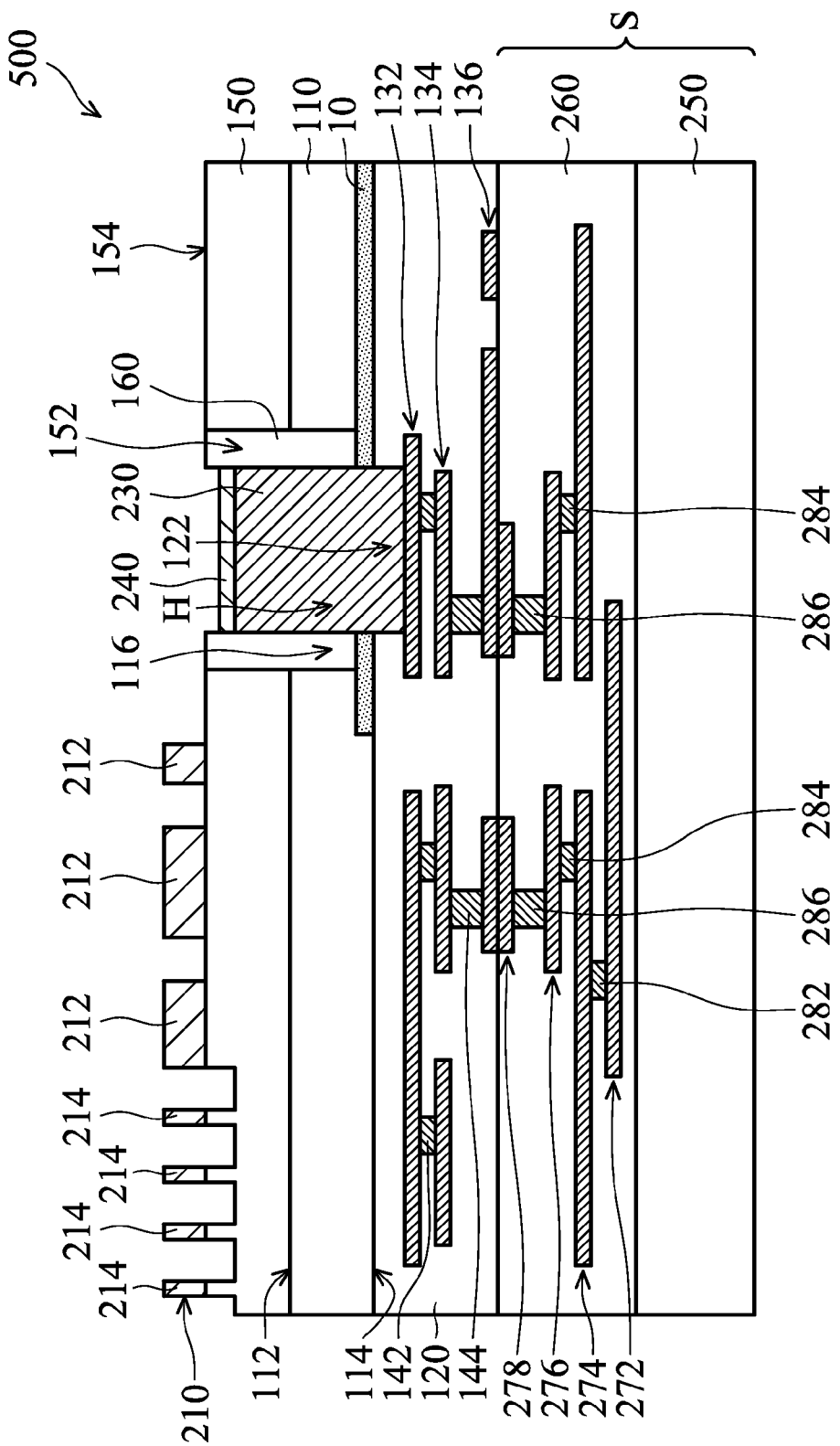

FIGS. 5A-5B are cross-sectional views of various stages of a process for forming a semiconductor device structure, in accordance with some embodiments. After the step of FIG. 1B, as shown in FIG. 5A, portions of the dielectric layer 150 and the semiconductor substrate 110 are removed, in accordance with some embodiments. After the removal process, an opening 152 and a recess 116 are formed, in accordance with some embodiments.

The opening 152 passes through the dielectric layer 150, in accordance with some embodiments. The recess 116 is formed in the semiconductor substrate 110 and recessed from the surface 112, in accordance with some embodiments. The recess 116 passes through the semiconductor substrate 110, in accordance with some embodiments. The recess 116 exposes a portion of the insulating layer 10, in accordance with some embodiments. In some embodiments, the removal process includes a photolithography process and an etching process.

As shown in FIG. 5A, an insulating layer 160 is formed in the opening 152 and the recess 116, in accordance with some embodiments. The insulating layer 160 is in direct contact with the insulating layer 10, in accordance with some embodiments. The insulating layer 160 includes oxide, such as silicon oxide, in accordance with some embodiments.

As shown in FIG. 5A, the steps of FIGS. 1H-1I are performed to form an opaque layer 210 and recesses 156, in accordance with some embodiments. The opaque layer 210 is formed over the top surface 154 of the dielectric layer 150, in accordance with some embodiments.

The opaque layer 210 has light-blocking portions 212 and grid portions 214, in accordance with some embodiments. As shown in FIG. 5A, recesses 156 are formed in the dielectric layer 150 and between the grid portions 214 or between the grid portion 214 and the light-blocking portion 212, in accordance with some embodiments.

As shown in FIG. 5B, portions of the insulating layers 160 and 10 and the dielectric layer 120 are removed, in accordance with some embodiments. After the removal process, a through hole H and an opening 122 are formed, in accordance with some embodiments. The through hole H passes through the insulating layers 160 and 10, in accordance with some embodiments.

The opening 122 is in the dielectric layer 120 and under the recess 116, in accordance with some embodiments. The opening 122 is connected to the through hole H, in accordance with some embodiments. The opening 122 and the through hole H together expose a portion of the wiring layer 132, in accordance with some embodiments. The removal process includes a photolithography process and an etching process.

As shown in FIG. 5B, a nickel layer 230 is formed in the through hole H and the opening 122, in accordance with some embodiments. The opening 122 is filled with the nickel layer 230, in accordance with some embodiments. The through hole H is partially filled with the nickel layer 230, in accordance with some embodiments. In some other embodiments, the through hole H is filled with the nickel layer 230, in accordance with some embodiments.

The nickel layer 230 is electrically connected to the wiring layer 132, in accordance with some embodiments. The nickel layer 230 is in direct contact with the wiring layer 132, in accordance with some embodiments. The nickel layer 230 is in direct contact with the insulating layers 160 and 10 and the dielectric layer 120, in accordance with some embodiments.

The nickel layer 230 is formed using an electroless plating process, in accordance with some embodiments. The nickel layer 230 contains nickel as a major component, in accordance with some embodiments. The nickel layer 230 contains at least 60 wt % of nickel, in accordance with some embodiments. The nickel layer 230 contains at least 80 wt % of nickel, in accordance with some embodiments.

As shown in FIG. 5B, a gold layer 240 is formed over the nickel layer 230, in accordance with some embodiments. The gold layer 240 contains gold as a major component, in accordance with some embodiments. The gold layer 240 contains at least 60 wt % of gold, in accordance with some embodiments.

The gold layer 240 contains at least 80 wt % of gold, in accordance with some embodiments. The gold layer 240 is formed using an immersion plating process, in accordance with some embodiments. The gold layer 240 and the nickel layer 230 do not extend onto the surface 112, in accordance with some embodiments. In this step, the semiconductor device structure 500 is substantially formed, in accordance with some embodiments.

Figure 6:
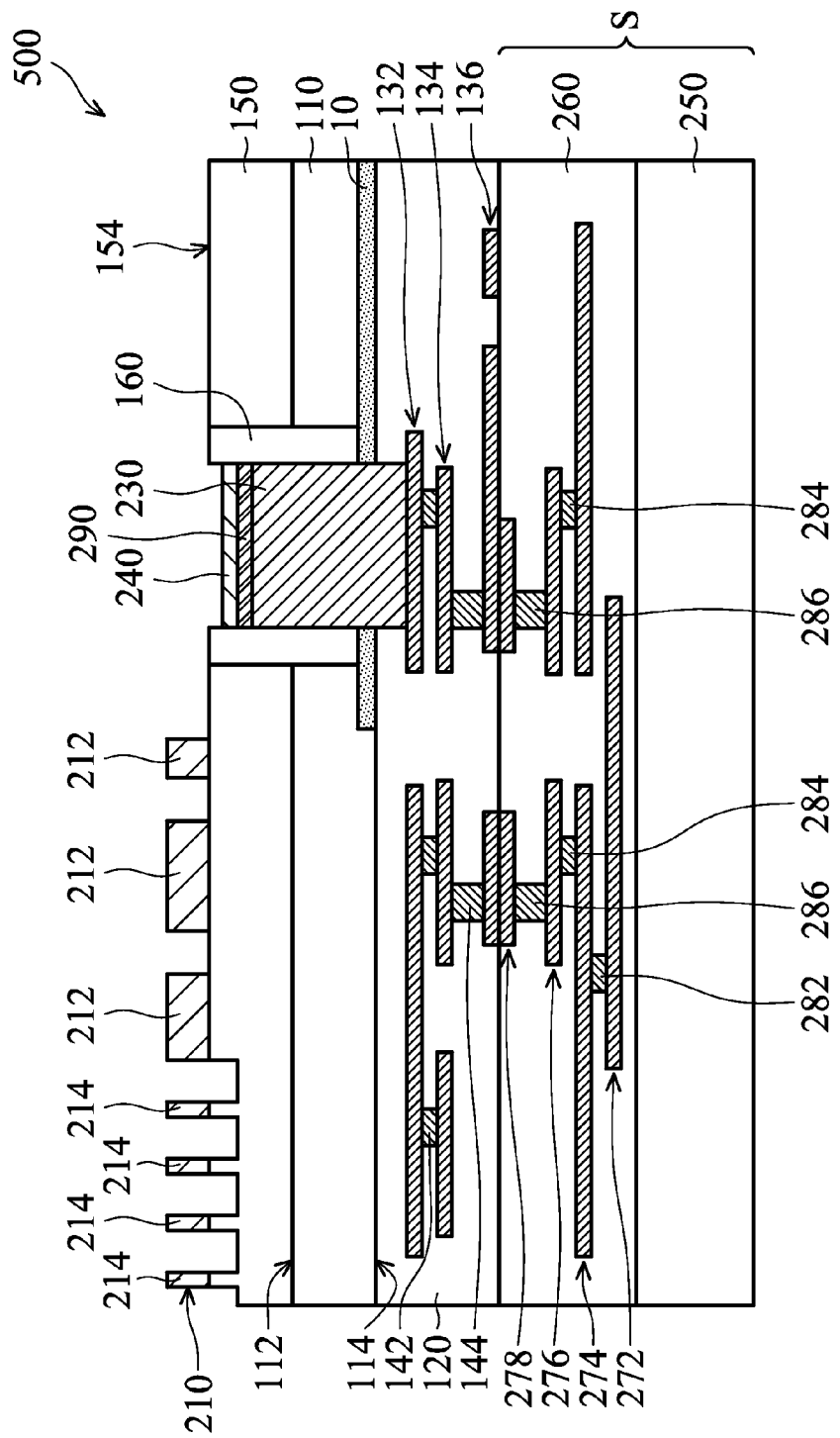
FIG. 6 is a cross-sectional view of a semiconductor device structure, in accordance with some embodiments.

FIG. 6 is a cross-sectional view of a semiconductor device structure, in accordance with some embodiments. As shown in FIG. 6, the semiconductor device structure 500 further includes a palladium layer 290, in accordance with some embodiments. The palladium layer 290 is formed between the nickel layer 230 and the gold layer 240, in accordance with some embodiments. The palladium layer 290 is in direct contact with the insulating layer 160, in accordance with some embodiments. The palladium layer 290 is formed using an electroless plating process, in accordance with some embodiments.

Figure 7:
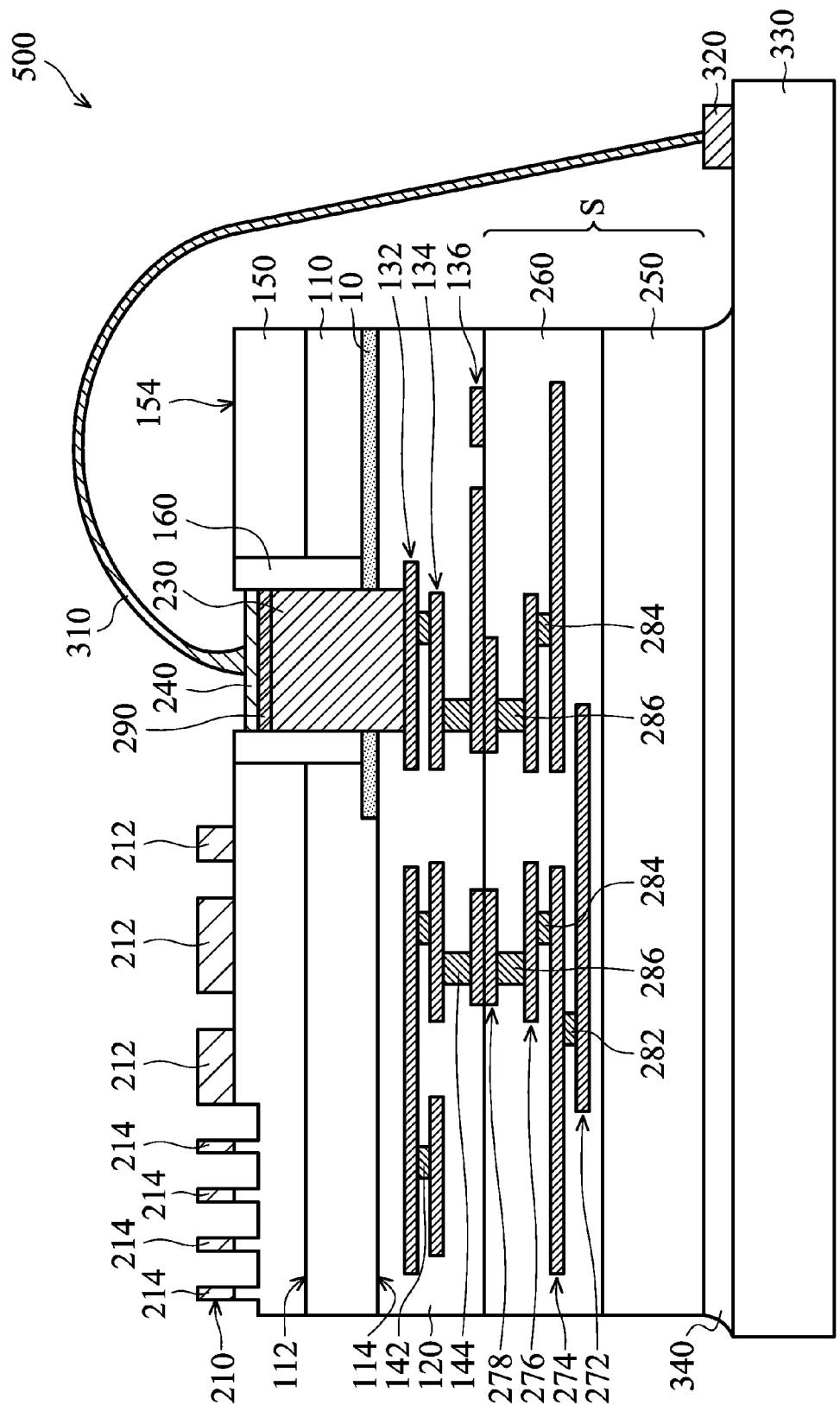
FIG. 7 is a cross-sectional view of a semiconductor device structure, in accordance with some embodiments.

FIG. 7 is a cross-sectional view of a semiconductor device structure, in accordance with some embodiments. As shown in FIG. 7, the semiconductor device structure 500 further includes a conductive wire 310 connecting the gold layer 240 to a bonding pad 320, in accordance with some embodiments. The conductive wire 310 is in direct contact with the gold layer 240 and the bonding pad 320, in accordance with some embodiments. In some embodiments, the bonding pad 320 is positioned over a substrate 330. The bonding pad 320 includes a conductive material, such as copper or aluminum, in accordance with some embodiments.

The substrate 330 includes a semiconductor material, a plastic material, a metal material, a glass material, a ceramic material, or another suitable material. In some embodiments, an adhesive layer 340 is formed between the semiconductor substrate 250 and the substrate 330. The adhesive layer 340 includes a polymer material, in accordance with some embodiments. In some other embodiments, the semiconductor substrate 250 is not over the substrate 330.

Figure 8:
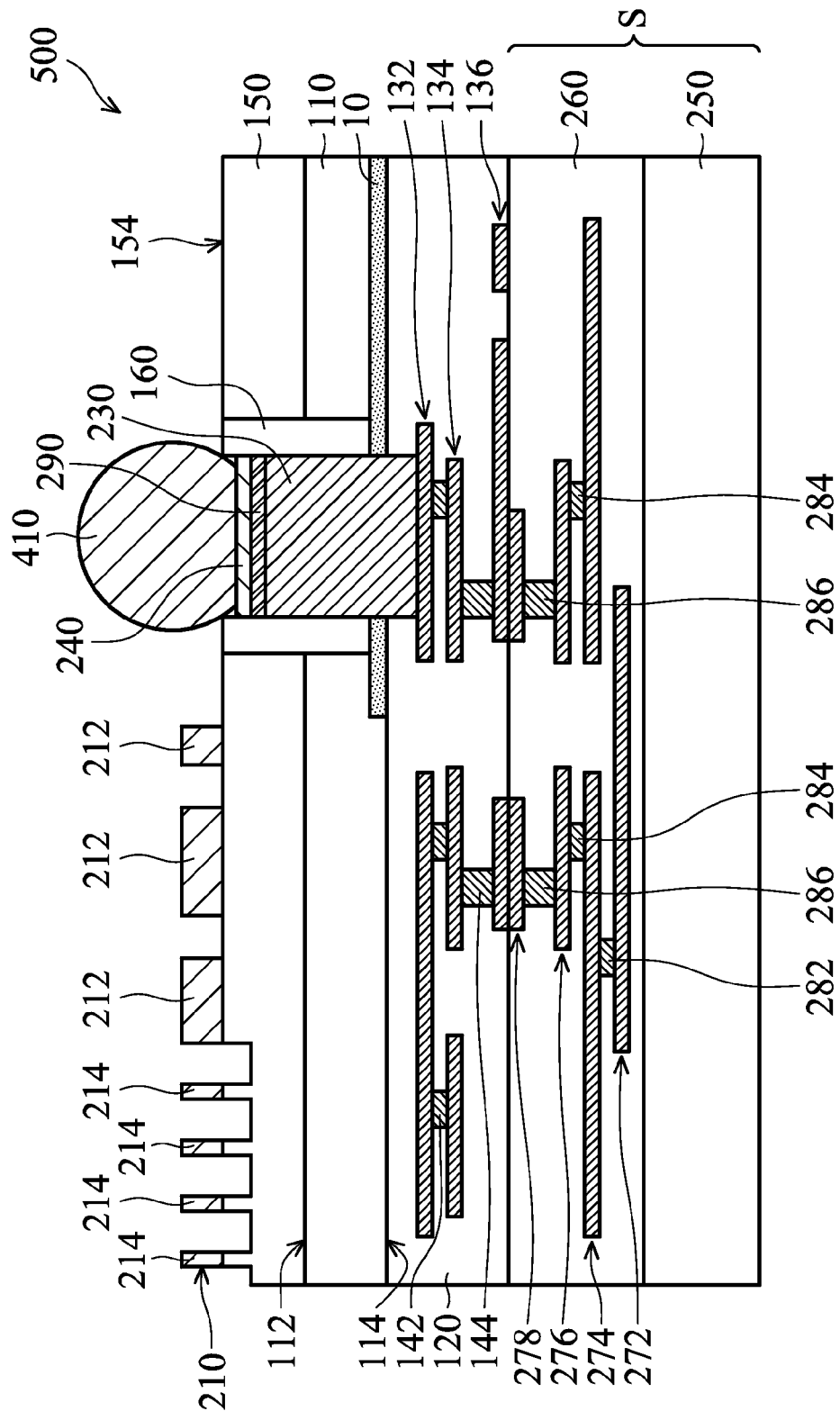
FIG. 8 is a cross-sectional view of a semiconductor device structure, in accordance with some embodiments.

FIG. 8 is a cross-sectional view of a semiconductor device structure, in accordance with some embodiments. As shown in FIG. 8, the semiconductor device structure 100 further includes a conductive bump 410 over the gold layer 240, in accordance with some embodiments. The conductive bump 410 is electrically connected to the gold layer 240, in accordance with some embodiments.

The conductive bump 410 is in direct contact with the gold layer 240, in accordance with some embodiments. The conductive bump 410 includes a conductive material, in accordance with some embodiments. The conductive bump 410 includes a solder material, such as tin (Sn) and copper (Cu), in accordance with some embodiments.

Figure 9:
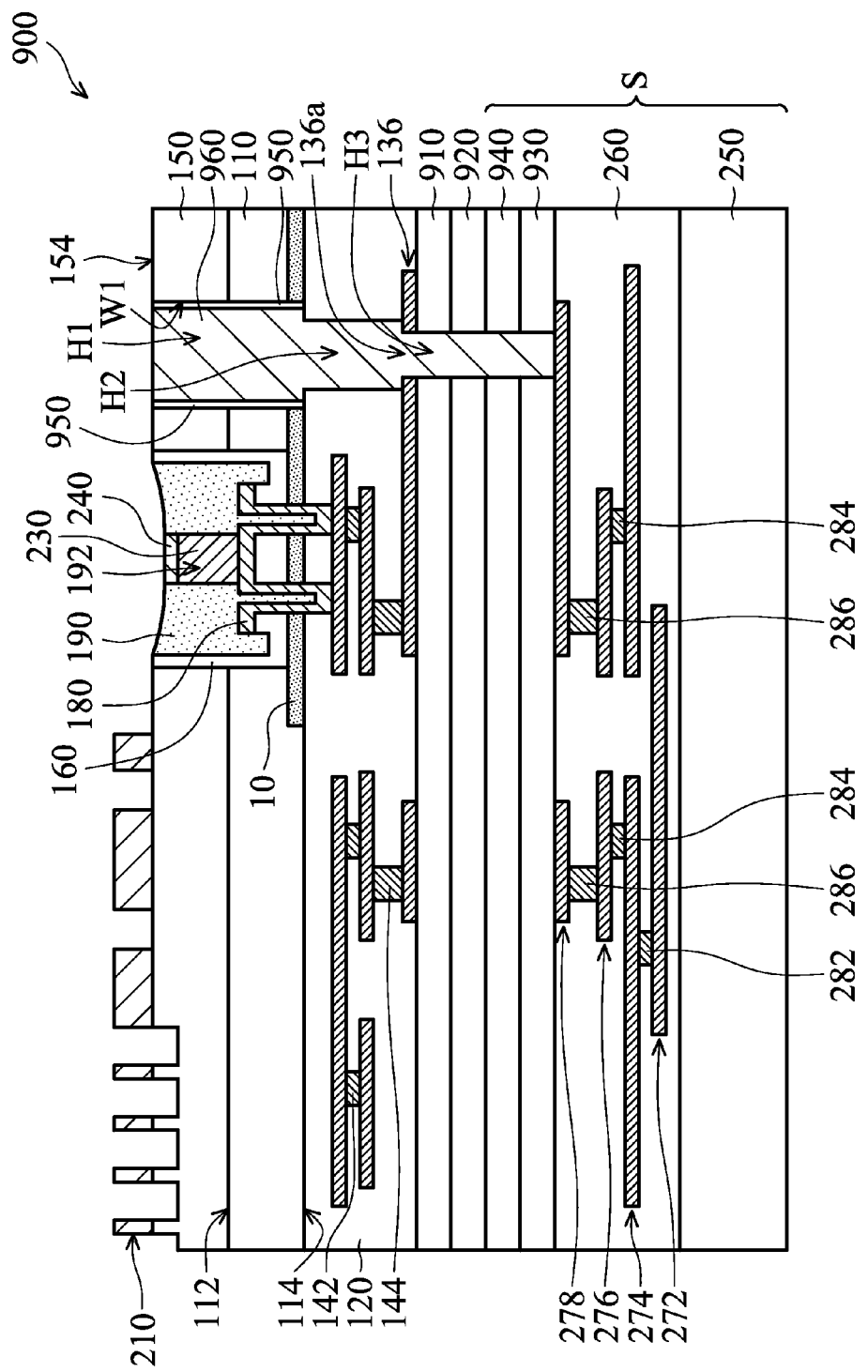
FIG. 9 is a cross-sectional view of a semiconductor device structure, in accordance with some embodiments.

FIG. 9 is a cross-sectional view of a semiconductor device structure, in accordance with some embodiments. As shown in FIG. 9, a semiconductor device structure 900 is similar to the semiconductor device structure 100 of FIG. 1L, except that the semiconductor device structure 900 further includes a dielectric layer 910, a passivation layer 920, a dielectric layer 930, a passivation layer 940, an insulating layer 950, and a conductive via structure 960, in accordance with some embodiments.

The dielectric layer 910 is formed over the dielectric layer 120 and the wiring layer 136, in accordance with some embodiments. The dielectric layers 910 and 120 have the same material, in accordance with some embodiments. The passivation layer 920 is formed over the dielectric layers 910, in accordance with some embodiments. The passivation layer 920 includes oxide (e.g., silicon oxide) or nitride, in accordance with some embodiments.

The wiring substrate S further includes the dielectric layer 930 and the passivation layer 940, in accordance with some embodiments. The dielectric layer 930 is formed over the wiring layer 278 and the dielectric layer 260, in accordance with some embodiments.

The dielectric layers 930 and 260 have the same material, in accordance with some embodiments. The passivation layer 940 is formed over the dielectric layer 930, in accordance with some embodiments. The passivation layer 940 includes oxide (e.g., silicon oxide) or nitride, in accordance with some embodiments. The passivation layers 920 and 940 are bonded with each other, in accordance with some embodiments.

As shown in FIG. 9, a through hole H1 passes through the dielectric layer 150, the semiconductor substrate 110, and the insulating layer 10, in accordance with some embodiments. The through hole H1 exposes a portion of the dielectric layer 120, in accordance with some embodiments. As shown in FIG. 9, the insulating layer 950 is formed over the inner wall W1 of the through hole H1, in accordance with some embodiments. The insulating layer 950 includes oxide, such as silicon oxide, in accordance with some embodiments.

As shown in FIG. 9, a through hole H2 passes through the dielectric layer 120, in accordance with some embodiments. As shown in FIG. 9, the wiring layer 136 has an opening 136a between the through hole H1 and the wiring layer 278, in accordance with some embodiments.

As shown in FIG. 9, a through hole H3 passes through the dielectric layer 910, the passivation layer 920, the dielectric layer 930, and the passivation layer 940, in accordance with some embodiments. The through holes H1, H2, and H3 and the opening 136a together expose a portion of the wiring layer 278, in accordance with some embodiments. The through holes H1, H2, and H3 and the opening 136a communicate (or are connected) with each other, in accordance with some embodiments.

The conductive via structure 960 is formed in the through holes H1, H2, and H3 and the opening 136a, in accordance with some embodiments. The through holes H1, H2, and H3 and the opening 136a are filled with the conductive via structure 960, in accordance with some embodiments. The conductive via structure 960 passes through the dielectric layer 150, the semiconductor substrate 110, the insulating layer 10, the dielectric layer 120, the dielectric layer 910, the passivation layer 920, the passivation layer 940, and the dielectric layer 930 sequentially, in accordance with some embodiments.

The conductive via structure 960 electrically connects the wiring layer 136 to the wiring layer 278, in accordance with some embodiments. The conductive via structure 960 includes a conductive material, in accordance with some embodiments. The conductive material includes tungsten, aluminum, copper, or another suitable conductive material.

Figure 10:
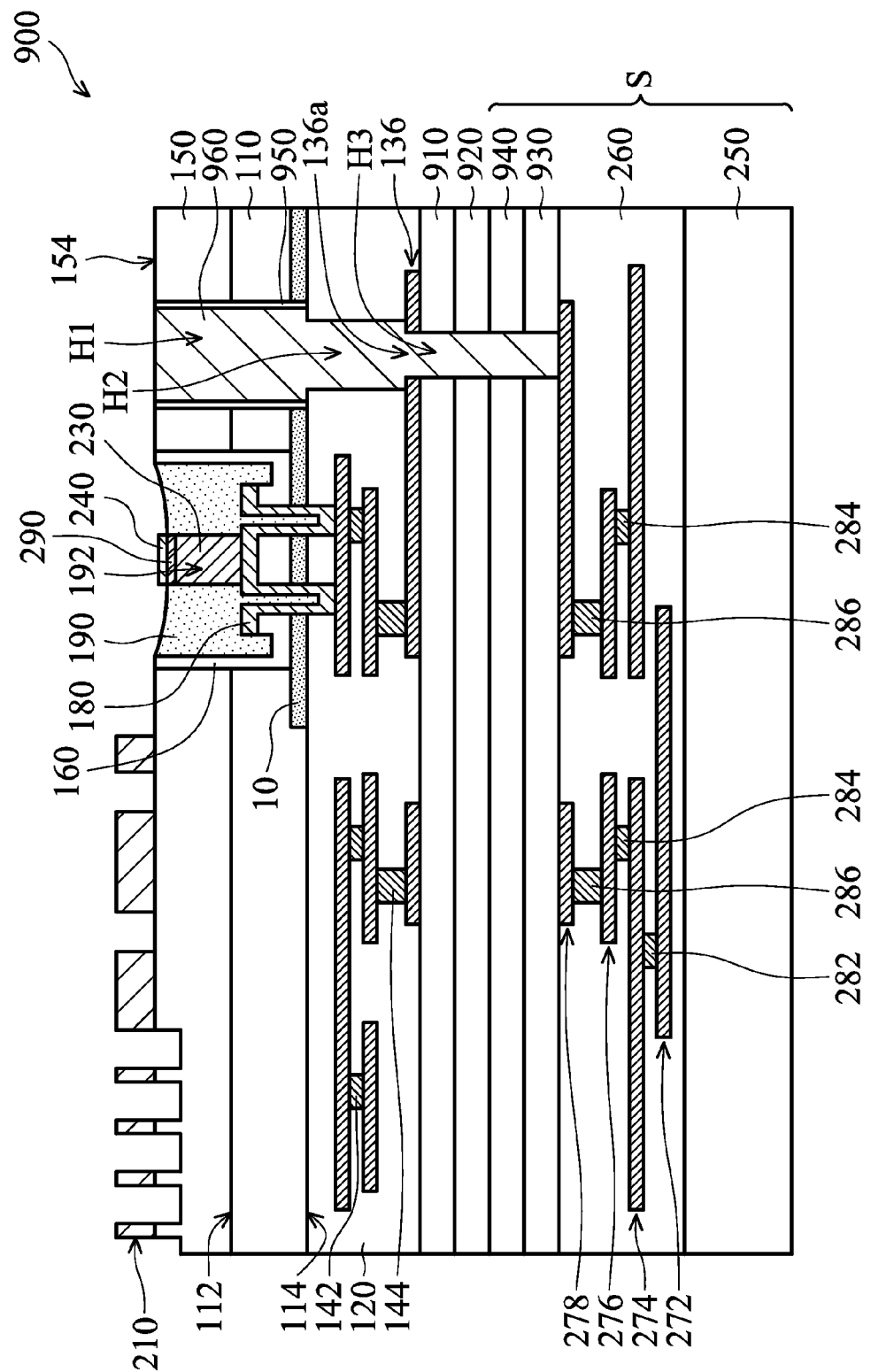
FIG. 10 is a cross-sectional view of a semiconductor device structure, in accordance with some embodiments.

FIG. 10 is a cross-sectional view of a semiconductor device structure, in accordance with some embodiments. As shown in FIG. 10, the semiconductor device structure 900 further includes a palladium layer 290, in accordance with some embodiments. The palladium layer 290 is formed between the nickel layer 230 and the gold layer 240, in accordance with some embodiments. The palladium layer 290 is formed using an electroless plating process, in accordance with some embodiments.

Figure 11:
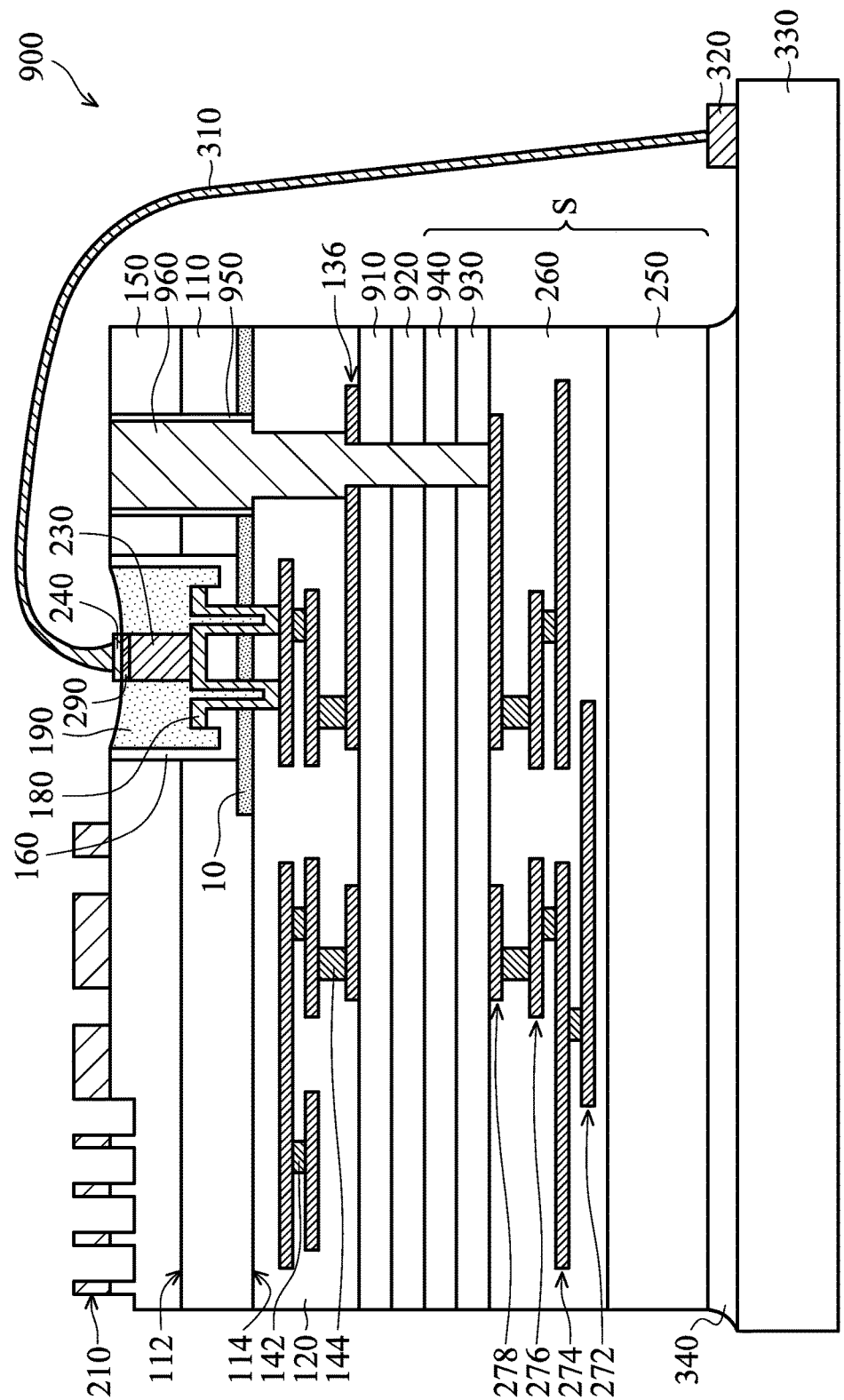
FIG. 11 is a cross-sectional view of a semiconductor device structure, in accordance with some embodiments.

FIG. 11 is a cross-sectional view of a semiconductor device structure, in accordance with some embodiments. As shown in FIG. 11, the semiconductor device structure 900 further includes a conductive wire 310 connecting the gold layer 240 to a bonding pad 320, in accordance with some embodiments. In some embodiments, the bonding pad 320 is positioned over a substrate 330. The bonding pad 320 includes a conductive material, such as copper or aluminum, in accordance with some embodiments.

The substrate 330 includes a semiconductor material, a plastic material, a metal material, a glass material, a ceramic material, or another suitable material. In some embodiments, an adhesive layer 340 is formed between the semiconductor substrate 250 and the substrate 330. The adhesive layer 340 includes a polymer material, in accordance with some embodiments. In some other embodiments, the semiconductor substrate 250 is not over the substrate 330.

Figure 12:
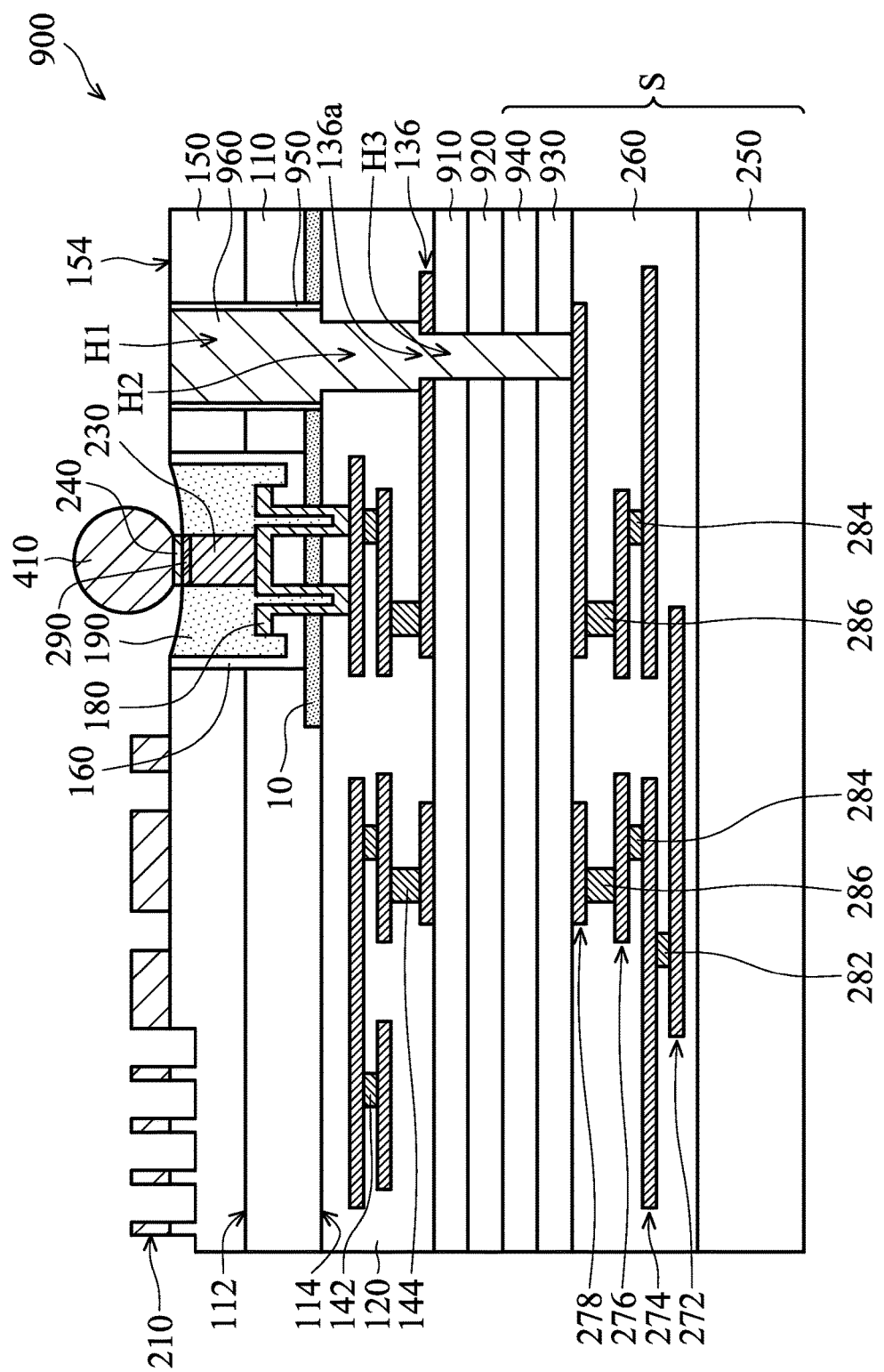
FIG. 12 is a cross-sectional view of a semiconductor device structure, in accordance with some embodiments.

FIG. 12 is a cross-sectional view of a semiconductor device structure, in accordance with some embodiments. As shown in FIG. 12, the semiconductor device structure 900 further includes a conductive bump 410 over the gold layer 240, in accordance with some embodiments. The conductive bump 410 is electrically connected to the gold layer 240, in accordance with some embodiments.

The conductive bump 410 is in direct contact with the gold layer 240, in accordance with some embodiments. The conductive bump 410 includes a conductive material, in accordance with some embodiments. The conductive bump 410 includes a solder material, such as tin (Sn) and copper (Cu), in accordance with some embodiments.

Figure 13:
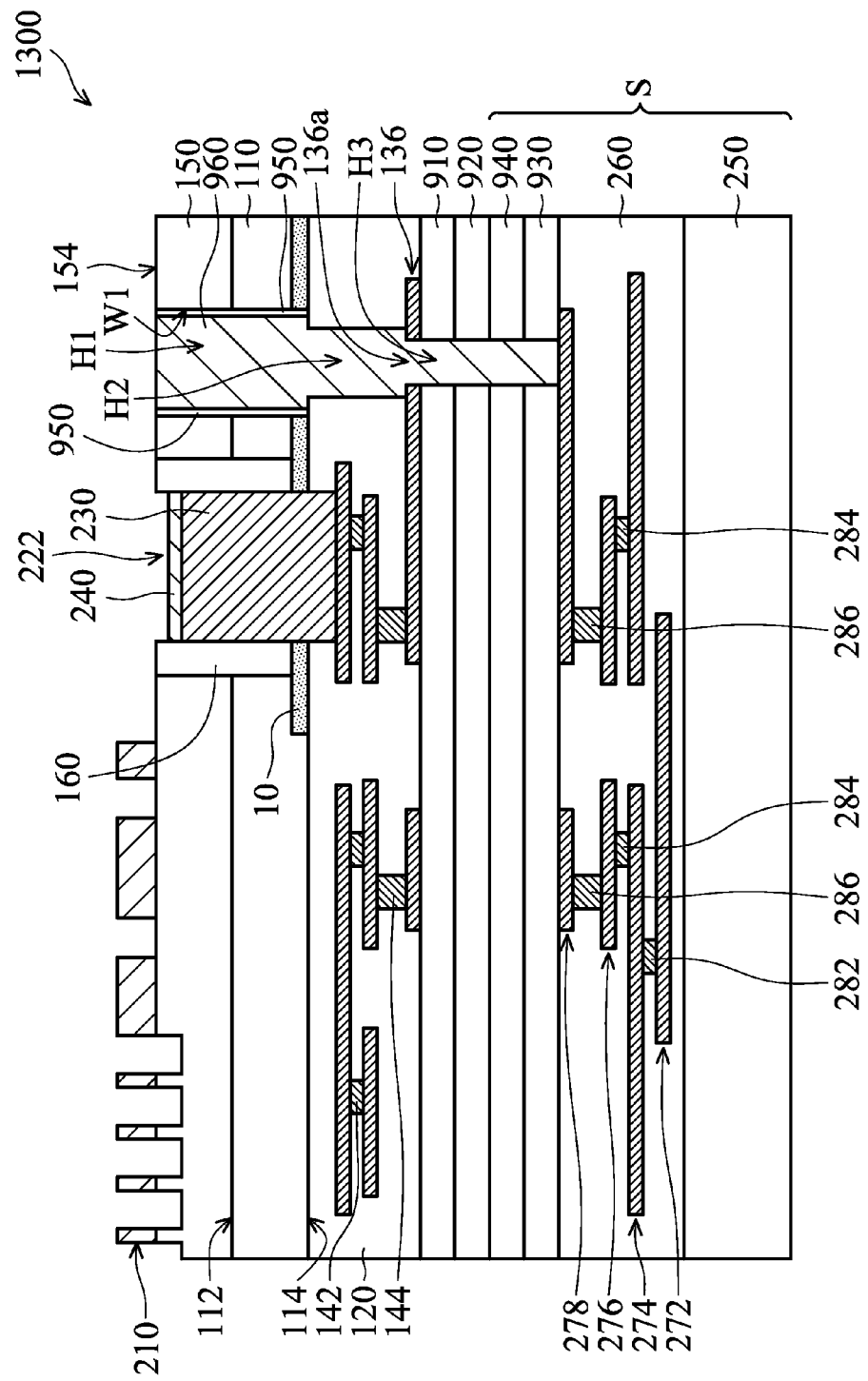
FIG. 13 is a cross-sectional view of a semiconductor device structure, in accordance with some embodiments.

FIG. 13 is a cross-sectional view of a semiconductor device structure, in accordance with some embodiments. As shown in FIG. 13, a semiconductor device structure 1300 is similar to the semiconductor device structure 500 of FIG. 5B, except that the semiconductor device structure 1300 further includes a dielectric layer 910, a passivation layer 920, a dielectric layer 930, a passivation layer 940, an insulating layer 950, and a conductive via structure 960, in accordance with some embodiments.

The dielectric layer 910 is formed over the dielectric layer 120 and the wiring layer 136, in accordance with some embodiments. The dielectric layers 910 and 120 have the same material, in accordance with some embodiments. The passivation layer 920 is formed over the dielectric layers 910, in accordance with some embodiments. The passivation layer 920 includes oxide (e.g., silicon oxide) or nitride, in accordance with some embodiments.

As shown in FIG. 13, the wiring substrate S further includes the dielectric layer 930 and the passivation layer 940, in accordance with some embodiments. The dielectric layer 930 is formed over the wiring layer 278 and the dielectric layer 260, in accordance with some embodiments.

The dielectric layers 930 and 260 have the same material, in accordance with some embodiments. The passivation layer 940 is formed over the dielectric layer 930, in accordance with some embodiments. The passivation layer 940 includes oxide (e.g., silicon oxide) or nitride, in accordance with some embodiments. The passivation layers 920 and 940 are bonded with each other, in accordance with some embodiments.

As shown in FIG. 13, a through hole H1 passes through the dielectric layer 150, the semiconductor substrate 110, and the insulating layer 10, in accordance with some embodiments. The through hole H1 exposes a portion of the dielectric layer 120, in accordance with some embodiments. As shown in FIG. 13, the insulating layer 950 is formed over the inner wall W1 of the through hole H1, in accordance with some embodiments. The insulating layer 950 includes oxide, such as silicon oxide, in accordance with some embodiments.

As shown in FIG. 13, a through hole H2 passes through the dielectric layer 120, in accordance with some embodiments. As shown in FIG. 13, the wiring layer 136 has an opening 136*a* between the through hole H1 and the wiring layer 278, in accordance with some embodiments.

As shown in FIG. 13, a through hole H3 passes through the dielectric layer 910, the passivation layer 920, the dielectric layer 930, and the passivation layer 940, in accordance with some embodiments. The through holes H1, H2, and H3 and the opening 136*a* together expose a portion of the wiring layer 278, in accordance with some embodiments. The through holes H1, H2, and H3 and the opening 136*a* communicate (or are connected) with each other, in accordance with some embodiments.

The conductive via structure 960 is formed in the through holes H1, H2, and H3 and the opening 136*a*, in accordance with some embodiments. The through holes H1, H2, and H3 and the opening 136*a* are filled with the conductive via structure 960, in accordance with some embodiments.

The conductive via structure 960 passes through the dielectric layer 150, the semiconductor substrate 110, the insulating layer 10, the dielectric layer 120, the dielectric layer 910, the passivation layer 920, the passivation layer 940, and the dielectric layer 930 sequentially, in accordance with some embodiments.

The conductive via structure 960 electrically connects the wiring layer 136 to the wiring layer 278, in accordance with some embodiments. The conductive via structure 960 includes a conductive material, in accordance with some embodiments. The conductive material includes tungsten, aluminum, copper, or another suitable conductive material.

Figure 14:
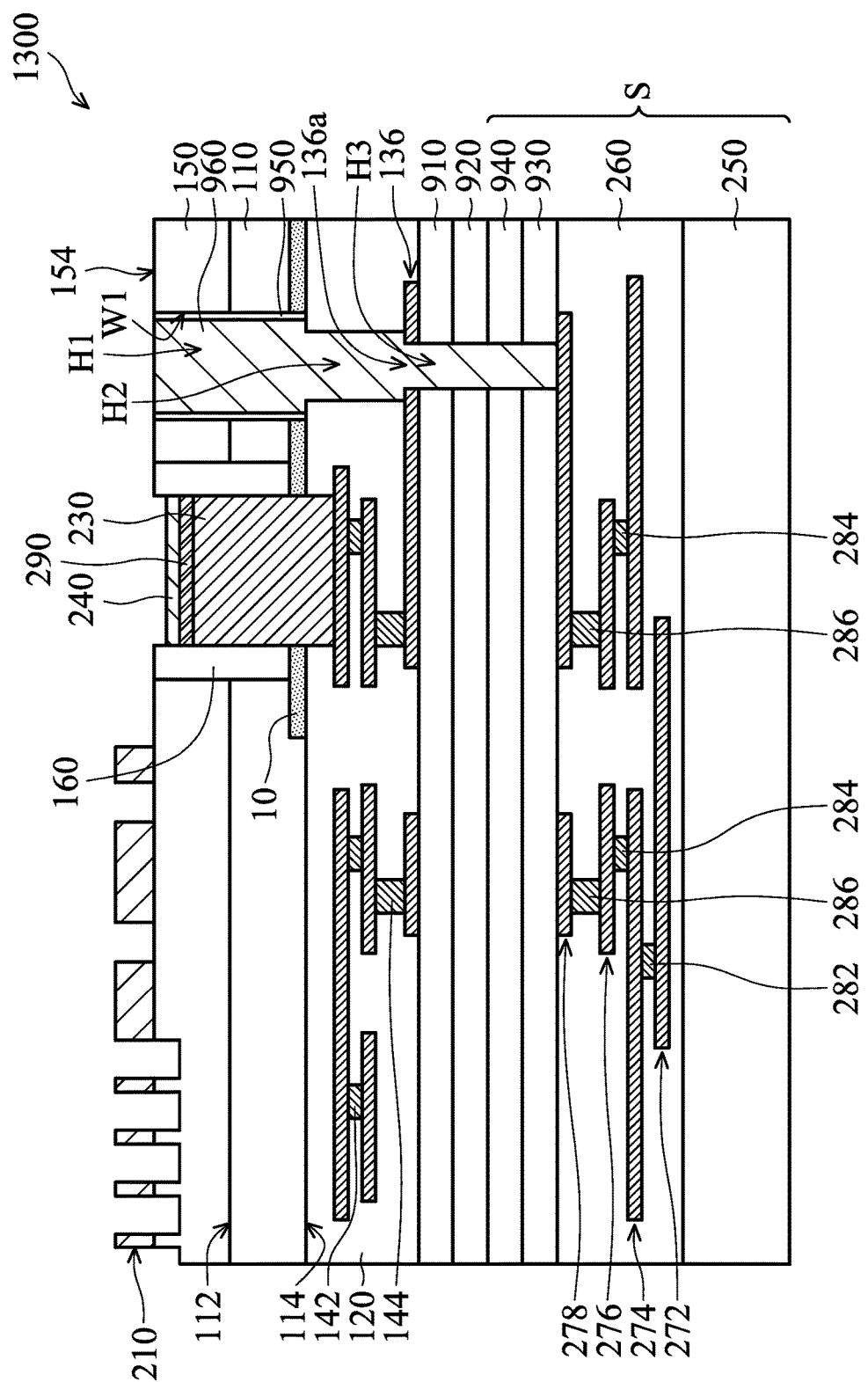
FIG. 14 is a cross-sectional view of a semiconductor device structure, in accordance with some embodiments.

FIG. 14 is a cross-sectional view of a semiconductor device structure, in accordance with some embodiments. As shown in FIG. 14, the semiconductor device structure 1300 further includes a palladium layer 290, in accordance with some embodiments. The palladium layer 290 is formed between the nickel layer 230 and the gold layer 240, in accordance with some embodiments. The palladium layer 290 is formed using an electroless plating process, in accordance with some embodiments.

Figure 15:
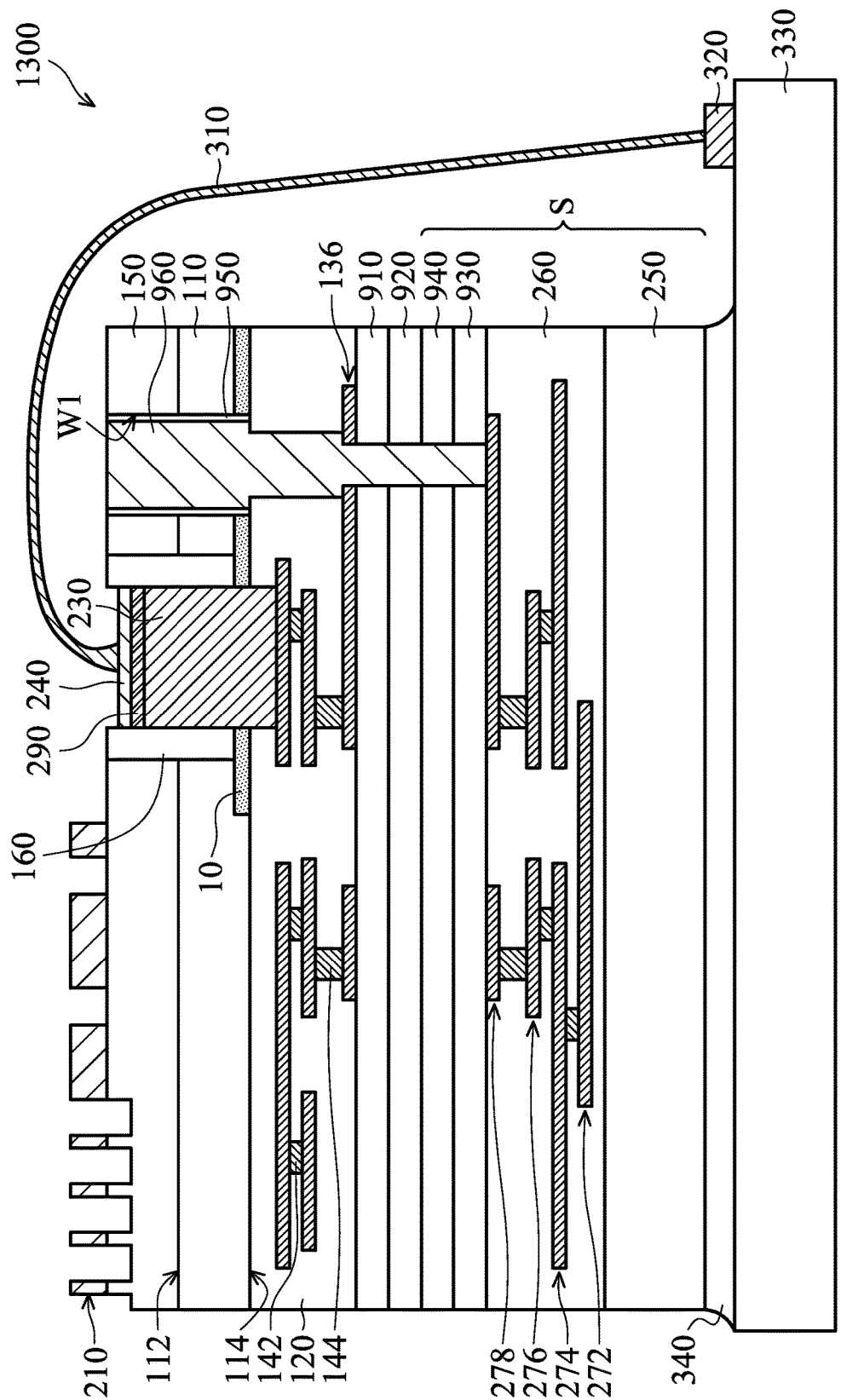
FIG. 15 is a cross-sectional view of a semiconductor device structure, in accordance with some embodiments.

FIG. 15 is a cross-sectional view of a semiconductor device structure, in accordance with some embodiments. As shown in FIG. 15, the semiconductor device structure 1300 further includes a conductive wire 310 connecting the gold layer 240 to a bonding pad 320, in accordance with some embodiments. In some embodiments, the bonding pad 320 is positioned over a substrate 330. The bonding pad 320 includes a conductive material, such as copper or aluminum, in accordance with some embodiments.

The substrate 330 includes a semiconductor material, a plastic material, a metal material, a glass material, a ceramic material, or another suitable material. In some embodiments, an adhesive layer 340 is formed between the semiconductor substrate 250 and the substrate 330. The adhesive layer 340 includes a polymer material, in accordance with some embodiments. In some other embodiments, the semiconductor substrate 250 is not over the substrate 330.

Figure 16:
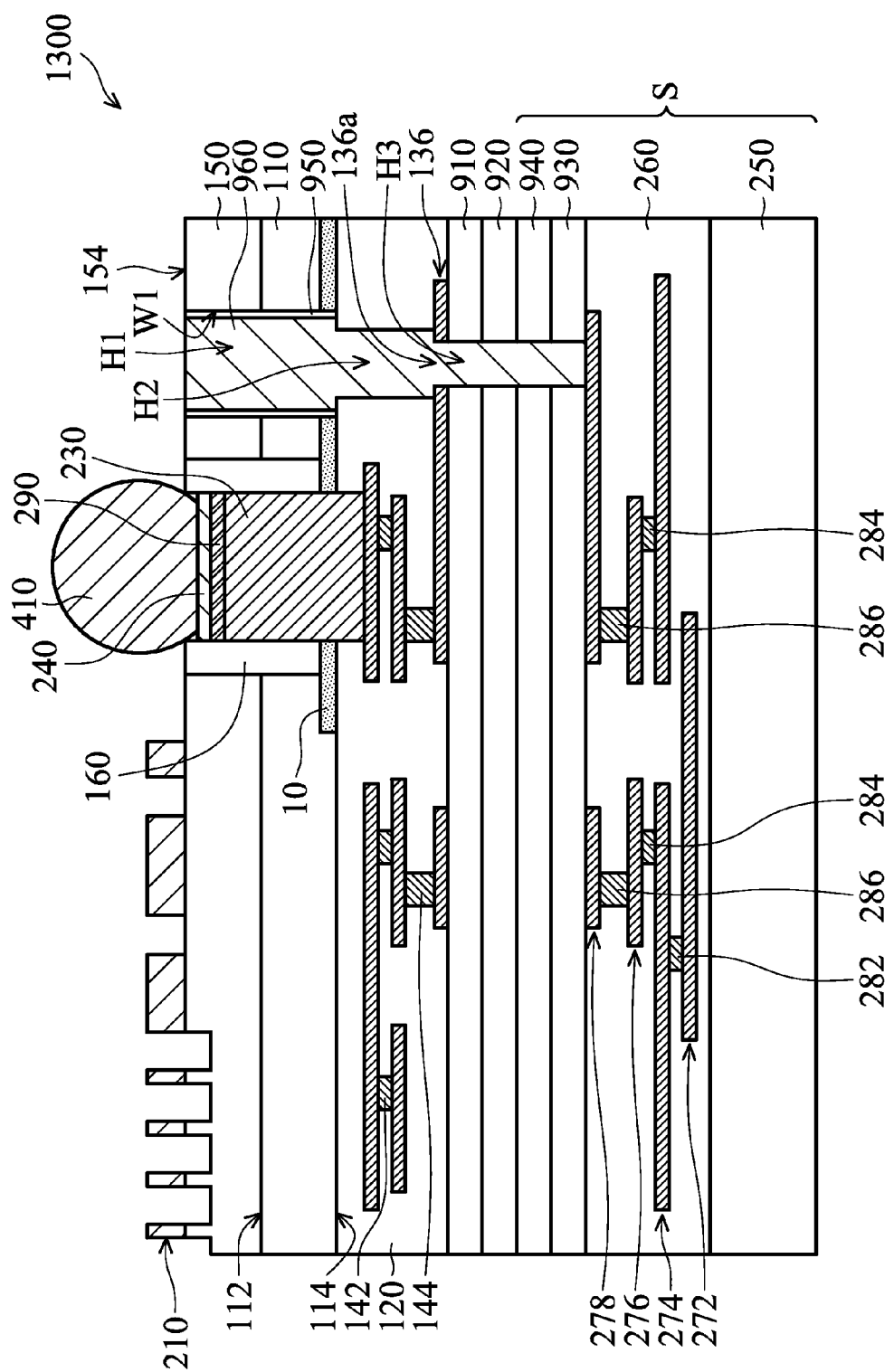
FIG. 16 is a cross-sectional view of a semiconductor device structure, in accordance with some embodiments.

FIG. 16 is a cross-sectional view of a semiconductor device structure, in accordance with some embodiments. As shown in FIG. 16, the semiconductor device structure 1300 further includes a conductive bump 410 over the gold layer 240, in accordance with some embodiments. The conductive bump 410 is electrically connected to the gold layer 240, in accordance with some embodiments. The conductive bump 410 includes a conductive material, in accordance with some embodiments. The conductive bump 410 includes a solder material, such as tin (Sn) and copper (Cu), in accordance with some embodiments.

Figure 17:
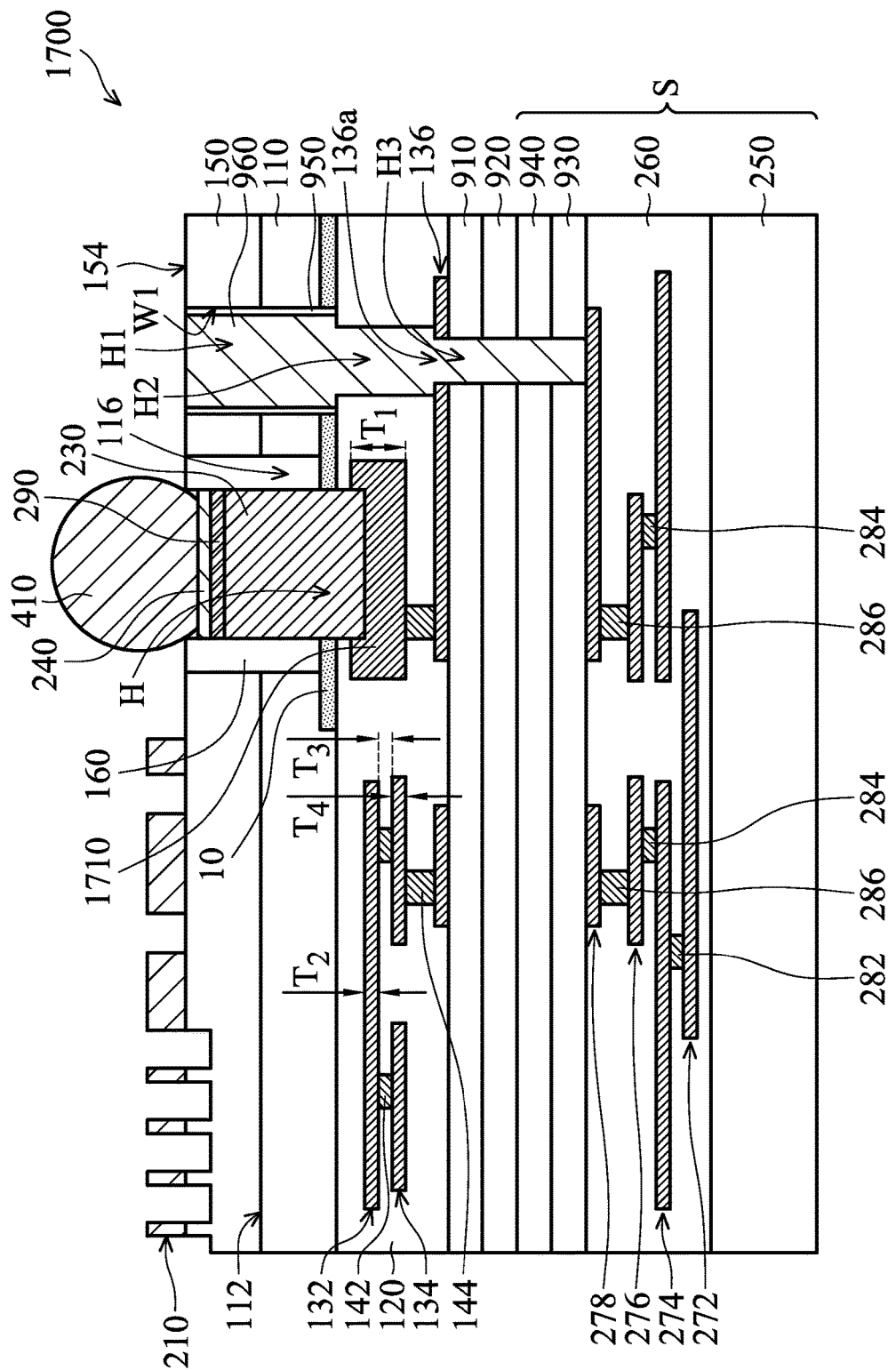
FIG. 17 is a cross-sectional view of a semiconductor device structure, in accordance with some embodiments.

FIG. 17 is a cross-sectional view of a semiconductor device structure 1700, in accordance with some embodiments. As shown in FIG. 17, the semiconductor device structure 1700 is similar to the semiconductor device structure 1300 of FIG. 16, except that the semiconductor device structure 1700 further has a thick wiring layer 1710 under the nickel layer 230, in accordance with some embodiments.

The nickel layer 230 is in direct contact with the thick wiring layer 1710, in accordance with some embodiments. The nickel layer 230 is electrically connected to the thick wiring layer 1710, in accordance with some embodiments. The thick wiring layer 1710 is adjacent to the wiring layers 132 and 134 and the conductive via structure 142, in accordance with some embodiments.

The thick wiring layer 1710 has a thickness T1, in accordance with some embodiments. The wiring layer 132 has a thickness T2, in accordance with some embodiments. The conductive via structure 142 has a thickness T3, in accordance with some embodiments. The wiring layer 134 has a thickness T4, in accordance with some embodiments. The thickness T1 is greater than the thicknesses T2, T3, or T4, in accordance with some embodiments. The thickness T1 is greater than or equal to the sum of the thicknesses T2, T3, and T4, in accordance with some embodiments.

The through hole H may extend into the thick wiring layer 1710 due to over etching. Since the thick wiring layer 1710 has a large thickness T1, the through hole H is prevented from passing through the thick wiring layer 1710. Therefore, the formation of the thick wiring layer 1710 improves the yield of the semiconductor device structure 1700.

Figure 18A:
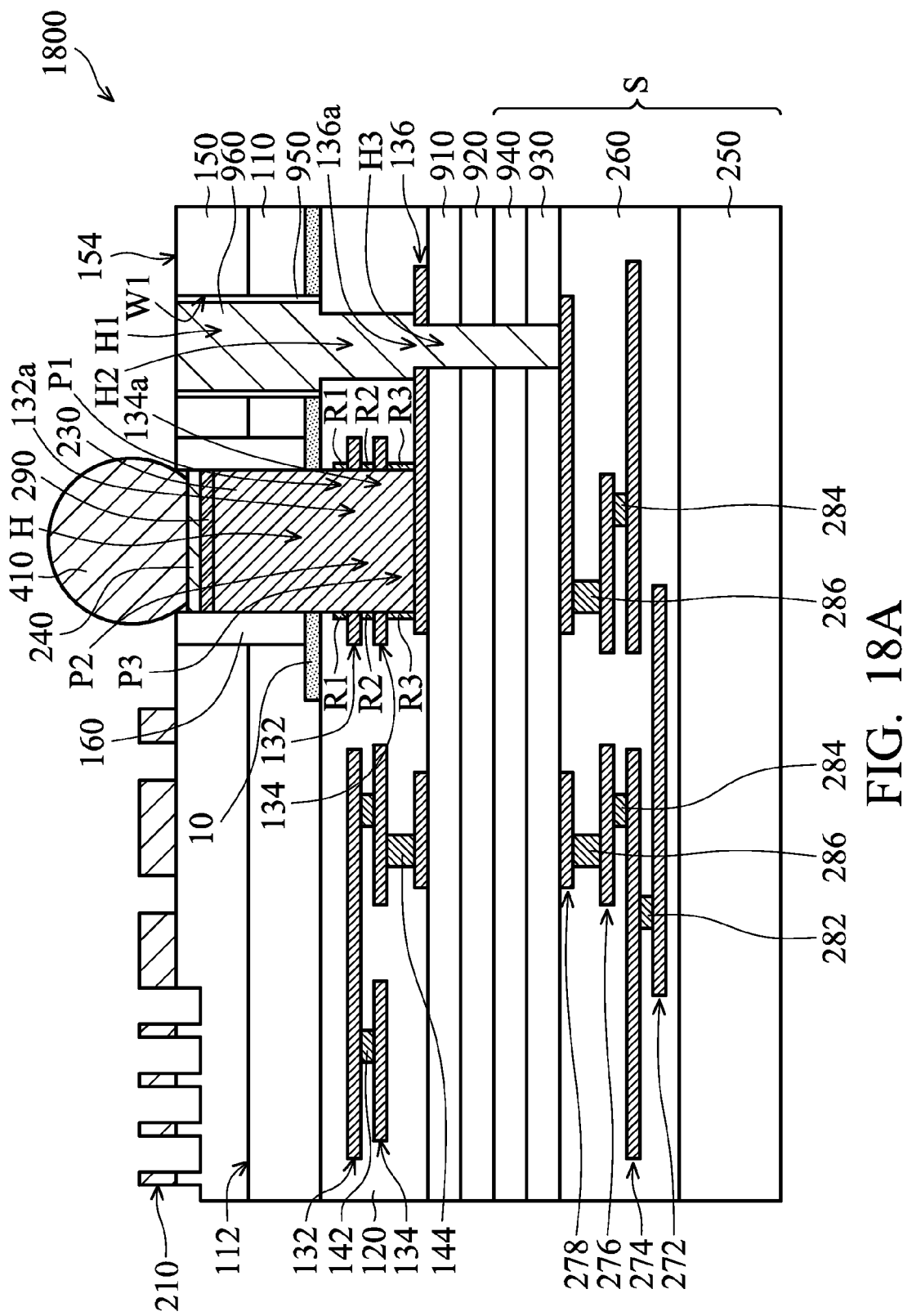
FIG. 18A is a cross-sectional view of a semiconductor device structure, in accordance with some embodiments.
Figure 18B:
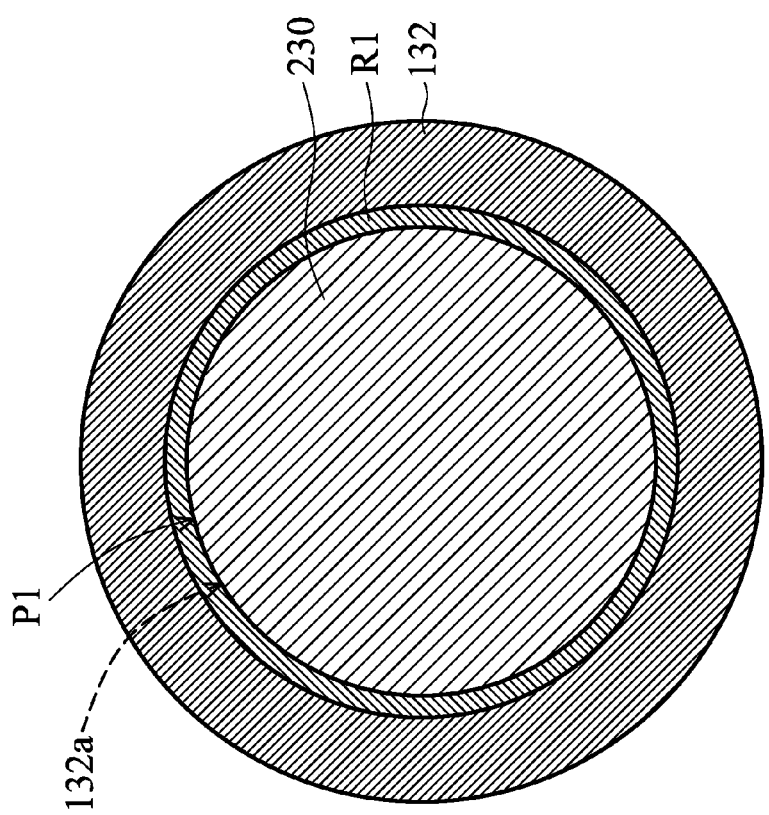
FIG. 18B is a top view of a nickel layer, a conductive ring structure, and a portion of a wiring layer of the semiconductor device structure of FIG. 18A, in accordance with some embodiments.

FIG. 18A is a cross-sectional view of a semiconductor device structure 1800, in accordance with some embodiments. FIG. 18B is a top view of a nickel layer 230, a conductive ring structure R1, and a portion of the wiring layer 132 of the semiconductor device structure 1800, in accordance with some embodiments.

As shown in FIGS. 18A and 18B, the semiconductor device structure 1800 is similar to the semiconductor device structure 1300 of FIG. 16, except that the semiconductor device structure 1800 further has conductive ring structures R1, R2, and R3, in accordance with some embodiments.

The conductive ring structure R1 is formed in the dielectric layer 120 and over the wiring layer 132, in accordance with some embodiments. The conductive ring structure R1 is connected with the wiring layer 132, in accordance with some embodiments. The conductive ring structure R2 is formed in the dielectric layer 120 and between the wiring layers 132 and 134, in accordance with some embodiments.

The conductive ring structure R2 is connected with the wiring layers 132 and 134, in accordance with some embodiments. The conductive ring structure R3 is formed in the dielectric layer 120 and between the wiring layers 134 and 136, in accordance with some embodiments. The conductive ring structure R3 is connected with the wiring layers 134 and 136, in accordance with some embodiments. The conductive ring structures R1, R2, and R3 and the wiring layers 132 and 134 are made of the same material, in accordance with some embodiments.

The conductive ring structures R1, R2, and R3 and the wiring layers 132 and 134 have openings P1, P2, P3, 132*a*, and 134*a* respectively, in accordance with some embodiments. The openings P1, P2, P3, 132*a*, and 134*a* are connected with each other, in accordance with some embodiments. The nickel layer 230 further extends into the openings P1, P2, P3, 132*a*, and 134*a*, in accordance with some embodiments. The conductive ring structures R1, R2, and R3 and the wiring layers 132 and 134 surround the nickel layer 230, in accordance with some embodiments.

The conductive ring structures R1, R2, and R3 and the wiring layers 132 and 134 together prevent the electroplating solution (for forming the nickel layer 230) from diffusing into the dielectric layer 120, in accordance with some embodiments. Therefore, the yield of the semiconductor device structure 1800 is improved, in accordance with some embodiments.

Figure 19:
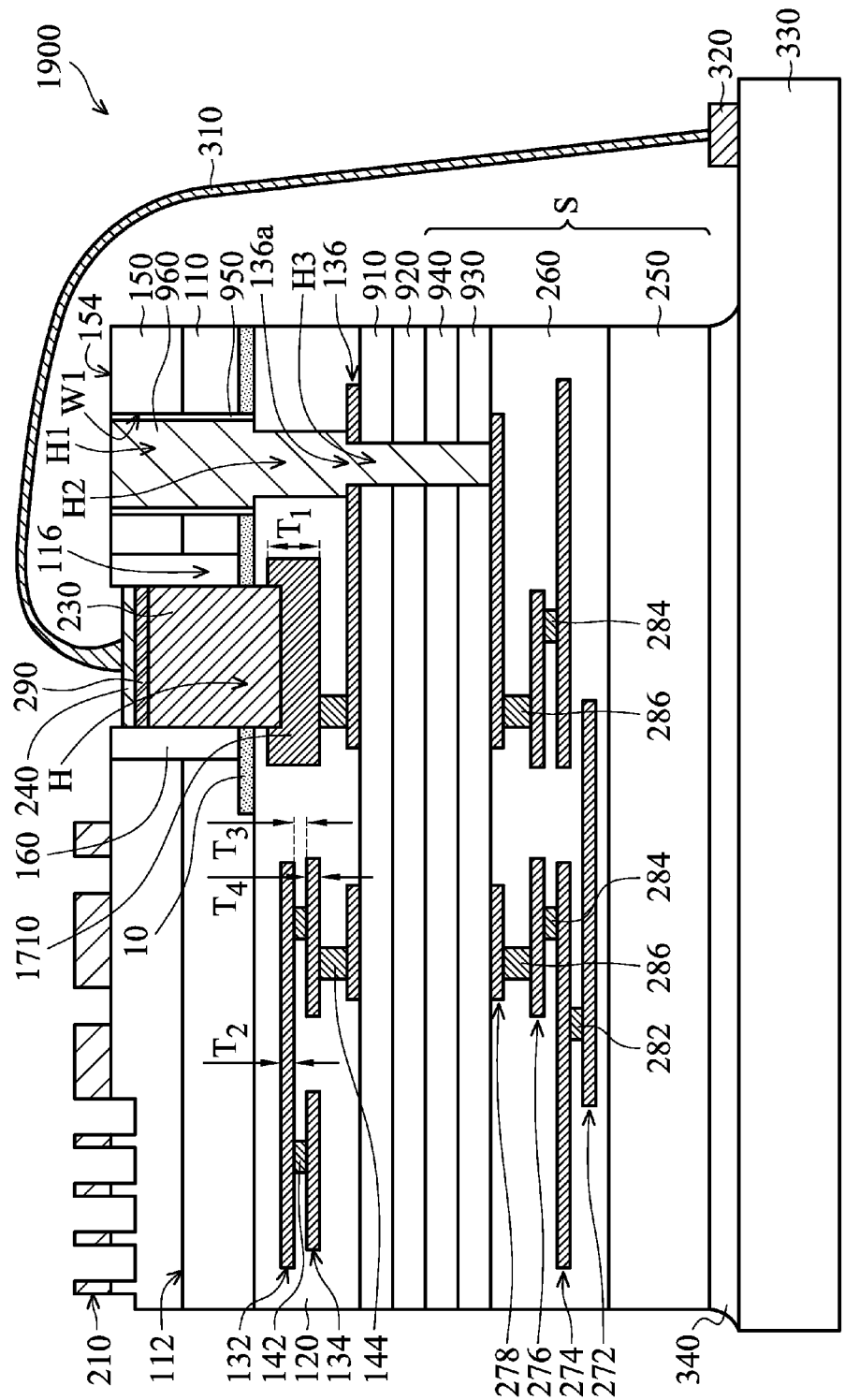
FIG. 19 is a cross-sectional view of a semiconductor device structure, in accordance with some embodiments.

FIG. 19 is a cross-sectional view of a semiconductor device structure, in accordance with some embodiments. As shown in FIG. 19, the semiconductor device structure 1900 is similar to the semiconductor device structure 1700 of FIG. 17, except that the semiconductor device structure 1900 further includes a conductive wire 310 connecting the gold layer 240 to a bonding pad 320, and the semiconductor device structure 1900 does not have the conductive bump 410, in accordance with some embodiments.

In some embodiments, the bonding pad 320 is positioned over a substrate 330. The bonding pad 320 includes a conductive material, such as copper or aluminum, in accordance with some embodiments. The substrate 330 includes a semiconductor material, a plastic material, a metal material, a glass material, a ceramic material, or another suitable material.

In some embodiments, an adhesive layer 340 is formed between the semiconductor substrate 250 and the substrate 330. The adhesive layer 340 includes a polymer material, in accordance with some embodiments. In some other embodiments, the semiconductor substrate 250 is not over the substrate 330.

Figure 20:
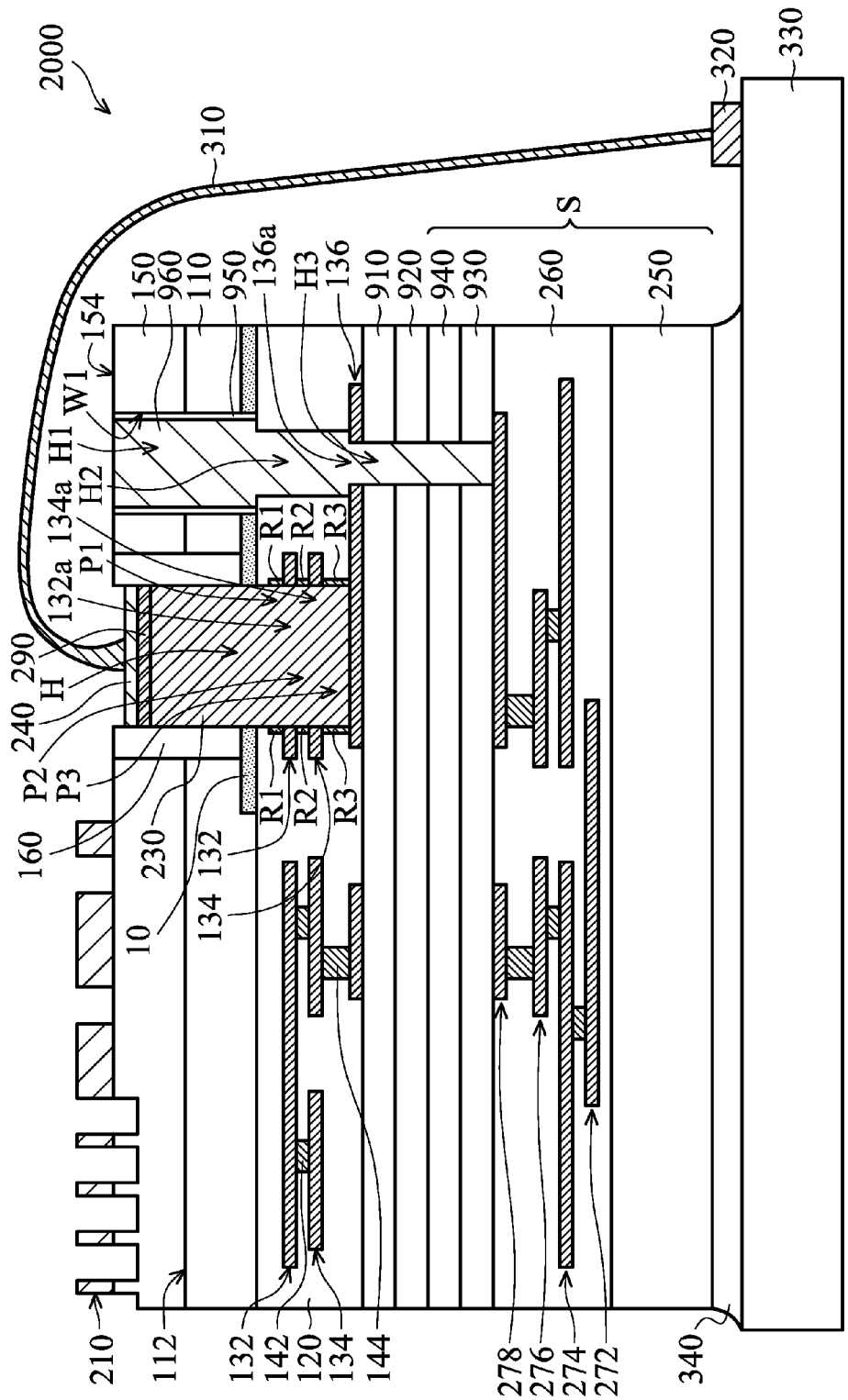
FIG. 20 is a cross-sectional view of a semiconductor device structure, in accordance with some embodiments.

FIG. 20 is a cross-sectional view of a semiconductor device structure, in accordance with some embodiments. As shown in FIG. 20, the semiconductor device structure 2000 is similar to the semiconductor device structure 1800 of FIG. 18A, except that the semiconductor device structure 2000 further includes a conductive wire 310 connecting the gold layer 240 to a bonding pad 320, and the semiconductor device structure 2000 does not have the conductive bump 410, in accordance with some embodiments.

In some embodiments, the bonding pad 320 is positioned over a substrate 330. The bonding pad 320 includes a conductive material, such as copper or aluminum, in accordance with some embodiments. The substrate 330 includes a semiconductor material, a plastic material, a metal material, a glass material, a ceramic material, or another suitable material.

In some embodiments, an adhesive layer 340 is formed between the semiconductor substrate 250 and the substrate 330. The adhesive layer 340 includes a polymer material, in accordance with some embodiments. In some other embodiments, the semiconductor substrate 250 is not over the substrate 330.

In accordance with some embodiments, semiconductor device structures and methods for forming the same are provided. The methods (for forming the semiconductor device structure) form a nickel layer over a bonding pad to prevent the bonding pad from peeling off. The methods form a gold layer over the nickel layer to buffer the bonding stress generated by a wire bonding process or a ball bonding process. Therefore, the formation of the nickel layer and the gold layer improves the reliability of the semiconductor device structure.

In accordance with some embodiments, a semiconductor device structure is provided. The semiconductor device structure includes a first semiconductor substrate having a first surface, a second surface, and a recess. The second surface is opposite to the first surface. The recess passes through the first semiconductor substrate. The semiconductor device structure includes a first wiring layer over the second surface. The semiconductor device structure includes a first bonding pad in the recess and extending to the first wiring layer so as to be electrically connected to the first wiring layer. The semiconductor device structure includes a nickel layer over the first bonding pad. The semiconductor device structure includes a gold layer over the nickel layer.

In accordance with some embodiments, a semiconductor device structure is provided. The semiconductor device structure includes a first semiconductor substrate having a surface and a recess. The recess passes through the first semiconductor substrate. The semiconductor device structure includes a first wiring layer over the surface. The semiconductor device structure includes a nickel layer in the recess and extending to the first wiring layer so as to be electrically connected to the first wiring layer. The semiconductor device structure includes a gold layer over the nickel layer.

In accordance with some embodiments, a method for forming a semiconductor device structure is provided. The method includes providing a first semiconductor substrate having a surface. The method includes forming a first wiring layer over the surface. The method includes forming a recess in the first semiconductor substrate. The recess passes through the first semiconductor substrate to expose the first wiring layer. The method includes forming a first bonding pad in the recess. The first bonding pad extends to the first wiring layer so as to be electrically connected to the first wiring layer. The method includes forming a nickel layer over the first bonding pad. The method includes forming a gold layer over the nickel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a first semiconductor substrate having a first surface, a second surface, and a recess, wherein the second surface is opposite to the first surface, and the recess passes through the first semiconductor substrate;
   a first wiring layer below the second surface;
   a first bonding pad in the recess and extending to the first wiring layer so as to be electrically connected to the first wiring layer;
   a nickel layer over the first bonding pad; and
   a gold layer over the nickel layer, wherein a first thickness of the nickel layer is greater than a second thickness of the gold layer;
   a dielectric filling layer filling into the recess, wherein the dielectric filling layer has an opening exposing a portion of the first bonding pad, and the nickel layer and the gold layer are in the opening and wherein the dielectric filing layer has a curved upper surface overlying the first bonding pad and having a slope that increases as a distance from an edge of the recess decreases; and wherein the nickel layer and the gold layer have outermost sidewalls that are aligned along a line that intersects the first bonding pad at a location that is laterally separated from outermost sidewalls of the first bonding pad by a non-zero distance.

2. The semiconductor device structure as claimed in claim 1, further comprising:
a conductive bump over the gold layer.

3. The semiconductor device structure as claimed in claim 1, further comprising:
a first dielectric layer below the second surface, wherein the first wiring layer is in the first dielectric layer;
a second wiring layer is embedded in the first dielectric layer;
a second semiconductor substrate;
a second dielectric layer below the second semiconductor substrate and bonded with the first dielectric layer; and
a third wiring layer embedded in the second dielectric layer and bonded with the second wiring layer.

4. The semiconductor device structure as claimed in claim 1, further comprising:
a palladium layer between the nickel layer and the gold layer.

5. The semiconductor device structure as claimed in claim 1, wherein the nickel layer and the gold layer do not extend onto the first surface.

6. The semiconductor device structure as claimed in claim 1,
wherein the dielectric filling layer has a bottommost surface facing the first semiconductor substrate that is closer to the first wiring layer than a bottommost surface of the nickel layer facing the first semiconductor substrate.

7. A semiconductor device structure, comprising:
a first semiconductor substrate having a surface and a recess, wherein the recess passes through the first semiconductor substrate;
a first wiring layer below the surface;
a nickel layer in the recess and extending to the first wiring layer so as to be electrically connected to the first wiring layer;
a gold layer having a bottom surface arranged over a top surface of the nickel layer, wherein a first thickness of the nickel layer is greater than a second thickness of the gold layer;
an additional insulating layer vertically arranged between the first semiconductor substrate and the first wiring layer and directly contacting a sidewall and a horizontal surface of the first semiconductor substrate;
wherein the nickel layer and the gold layer have outermost sidewalls that are aligned along a line and that directly contact an insulating layer lining interior sidewalls of the recess and laterally separating the nickel layer from the first semiconductor substrate; and
wherein the gold layer has a top surface that is recessed below a top surface of the insulating layer, and wherein the insulating layer contacts a horizontal surface of the additional insulating layer facing the first semiconductor substrate.

8. The semiconductor device structure as claimed in claim 7, further comprising:
a dielectric layer over the surface, wherein the first wiring layer is in the dielectric layer, the dielectric layer has an opening under the recess and exposing a portion of the first wiring layer, and the opening is completely filled with nickel.

9. The semiconductor device structure as claimed in claim 7, wherein the nickel layer is in direct contact with the first wiring layer.

10. The semiconductor device structure as claimed in claim 7, further comprising:
a palladium layer between the nickel layer and the gold layer.

11. The semiconductor device structure as claimed in claim 7, further comprising:
a second wiring layer below the surface, wherein the first wiring layer is thicker than the second wiring layer.

12. The semiconductor device structure as claimed in claim 7, further comprising:
a conductive ring structure between the first wiring layer and the first semiconductor substrate, wherein the conductive ring structure surrounds the nickel layer and is connected with the first wiring layer.

13. The semiconductor device structure as claimed in claim 7, wherein the nickel layer protrudes outward from the first semiconductor substrate.

14. A method for forming a semiconductor device structure, comprising:
providing a first semiconductor substrate having a surface;
forming a first insulating layer laterally contacting a sidewall of the first semiconductor substrate;
forming a first wiring layer below the surface, wherein the first insulating layer is vertically arranged between the first semiconductor substrate and the first wiring layer;
forming a recess in the first semiconductor substrate, wherein the recess passes through the first semiconductor substrate and the first insulating layer to expose the first wiring layer;
forming a first bonding pad in the recess, wherein the first bonding pad extends to the first wiring layer so as to be electrically connected to the first wiring layer;
forming a second insulating layer lining interior sidewalls of the recess, wherein the second insulating layer contacts a horizontal surface of the first insulating layer facing the first semiconductor substrate;
forming a nickel layer over the first bonding pad, wherein the nickel layer is laterally separated from the first semiconductor substrate by the second insulating layer;
forming a gold layer over the nickel layer, wherein a first thickness of the nickel layer is greater than a second thickness of the gold layer, and wherein the nickel layer and the gold layer have outermost sidewalls that are aligned along a line that intersects the first bonding pad at a location that is laterally separated from outermost sidewalls of the first bonding pad by a non-zero distance;
forming a first dielectric layer below the surface, wherein the first wiring layer is in the first dielectric layer;
providing a second semiconductor substrate, a second dielectric layer, and a second wiring layer, wherein the second dielectric layer is below the second semiconductor substrate, and the second wiring layer is embedded in the second dielectric layer; and
bonding the first dielectric layer to the second dielectric layer, wherein the first wiring layer is electrically connected to the second wiring layer.

15. The method for forming a semiconductor device structure as claimed in claim 14, wherein the first bonding pad comprises interior sidewalls defining one or more depressions within an uppermost surface of the first bonding pad.

16. The semiconductor device structure as claimed in claim 1, further comprising:
   wherein the first bonding pad comprises cavities within a topmost surface of the first bonding pad that are arranged on opposing sides of the nickel layer, wherein the cavities are respectively defined by interior sidewalls of the first bonding pad coupled together by a lower interior surface of the first bonding pad; and
   wherein the dielectric filling layer completely fills the cavities.

17. The semiconductor device structure as claimed in claim 16, wherein the nickel layer has a bottommost surface that is above a topmost surface of the first bonding pad.

18. The semiconductor device structure as claimed in claim 1,
   wherein the dielectric filling layer has a bottommost surface that is below a bottommost surface of the nickel layer and a topmost surface of the first bonding pad.

19. The semiconductor device structure as claimed in claim 1, wherein an entirety of the gold layer is arranged over the nickel layer.

20. The method for forming a semiconductor device structure as claimed in claim 14, wherein the nickel layer is formed using an electroless plating process.

* * * * *